(12) United States Patent
Kobayashi

(10) Patent No.: US 11,723,235 B2
(45) Date of Patent: Aug. 8, 2023

(54) DISPLAY PANEL WITH OPENING ADJUSTING LAYER

(71) Applicant: JOLED Inc., Tokyo (JP)

(72) Inventor: Hideki Kobayashi, Tokyo (JP)

(73) Assignee: JOLED Inc., Tokyo (JP)

(*) Notice: Subject to any disclaimer, the term of this patent is extended or adjusted under 35 U.S.C. 154(b) by 38 days.

(21) Appl. No.: 16/988,067

(22) Filed: Aug. 7, 2020

(65) Prior Publication Data
US 2021/0043706 A1 Feb. 11, 2021

(30) Foreign Application Priority Data
Aug. 9, 2019 (JP) ................................. 2019-147390

(51) Int. Cl.

| | | |
|---|---|---|
| H01L 27/32 | (2006.01) | |
| H01L 51/50 | (2006.01) | |
| H01L 51/56 | (2006.01) | |
| H01L 51/52 | (2006.01) | |
| H10K 59/122 | (2023.01) | |
| H10K 50/15 | (2023.01) | |
| H10K 50/17 | (2023.01) | |
| H10K 50/852 | (2023.01) | |
| H10K 59/35 | (2023.01) | |

(Continued)

(52) U.S. Cl.
CPC .......... *H10K 59/122* (2023.02); *H10K 50/15* (2023.02); *H10K 50/17* (2023.02); *H10K 50/852* (2023.02); *H10K 59/352* (2023.02); *H10K 59/353* (2023.02); *H10K 71/00* (2023.02); *H10K 59/1201* (2023.02); *H10K 2102/351* (2023.02)

(58) Field of Classification Search
CPC ............ H01L 27/3246; H01L 27/3216; H01L 27/3218; H01L 51/5056; H01L 51/5088; H01L 51/5265; H01L 51/56; H01L 2227/323; H01L 2251/558
See application file for complete search history.

(56) References Cited

U.S. PATENT DOCUMENTS

| | | | |
|---|---|---|---|
| 10,914,873 B2* | 2/2021 | Zang | .................... H01L 27/124 |
| 2009/0085470 A1* | 4/2009 | Song | .................... H01L 51/506 |
| | | | 313/504 |

(Continued)

FOREIGN PATENT DOCUMENTS

| | | |
|---|---|---|
| JP | 2007080855 A | 3/2007 |
| JP | 2008091070 A | 4/2008 |

(Continued)

OTHER PUBLICATIONS

Office Action for JP Patent Application No. JP2019-147390, dated May 16, 2023, 2 pages of Office Action.

*Primary Examiner* — Peter Bradford
(74) *Attorney, Agent, or Firm* — Chip Law Group

(57) ABSTRACT

Disclosed herein is a display panel in which a plurality of pixel regions are arranged in a matrix form, the display panel including a substrate, a plurality of pixel electrodes, a partition wall, a first functional layer, a first light emitting layer, a second functional layer, and a second light emitting layer. As viewed in plan, a ratio of an area of the first functional layer to an area of the pixel region in which the first functional layer is present being lower than a ratio of an area of the second functional layer to an area of the pixel region in which the second functional layer is present.

8 Claims, 24 Drawing Sheets

(51) Int. Cl.
*H10K 71/00* (2023.01)
*H10K 59/12* (2023.01)
*H10K 102/00* (2023.01)

(56) References Cited

U.S. PATENT DOCUMENTS

| | | |
|---|---|---|
| 2012/0001186 A1 | 1/2012 | Kondoh et al. |
| 2012/0032207 A1 | 2/2012 | Nishiyama et al. |
| 2012/0091439 A1 | 4/2012 | Nishiyama et al. |
| 2014/0319484 A1* | 10/2014 | Kwon .................. H01L 27/326 |
| | | 257/40 |
| 2019/0207163 A1* | 7/2019 | Paek .................... H10K 71/135 |
| 2021/0202642 A1* | 7/2021 | Kwon ................. H01L 27/3216 |
| 2021/0384265 A1* | 12/2021 | Hou ....................... H10K 59/30 |

FOREIGN PATENT DOCUMENTS

| | | | |
|---|---|---|---|
| JP | 2008243517 A | | 10/2008 |
| JP | 2011054513 A | | 3/2011 |
| JP | 2011512762 A | | 4/2011 |
| JP | 2011514927 A | | 5/2011 |
| JP | 2011517706 A | | 6/2011 |
| JP | 2018026278 A | | 2/2018 |
| JP | 2018206710 A | | 12/2018 |
| KR | 20040000011 A | * | 1/2004 |
| WO | 2012004823 A1 | | 1/2012 |
| WO | 2012017494 A1 | | 2/2012 |
| WO | 2012017500 A1 | | 2/2012 |
| WO | WO-2021117076 A1 | * | 6/2021 ......... H01L 51/5056 |

\* cited by examiner

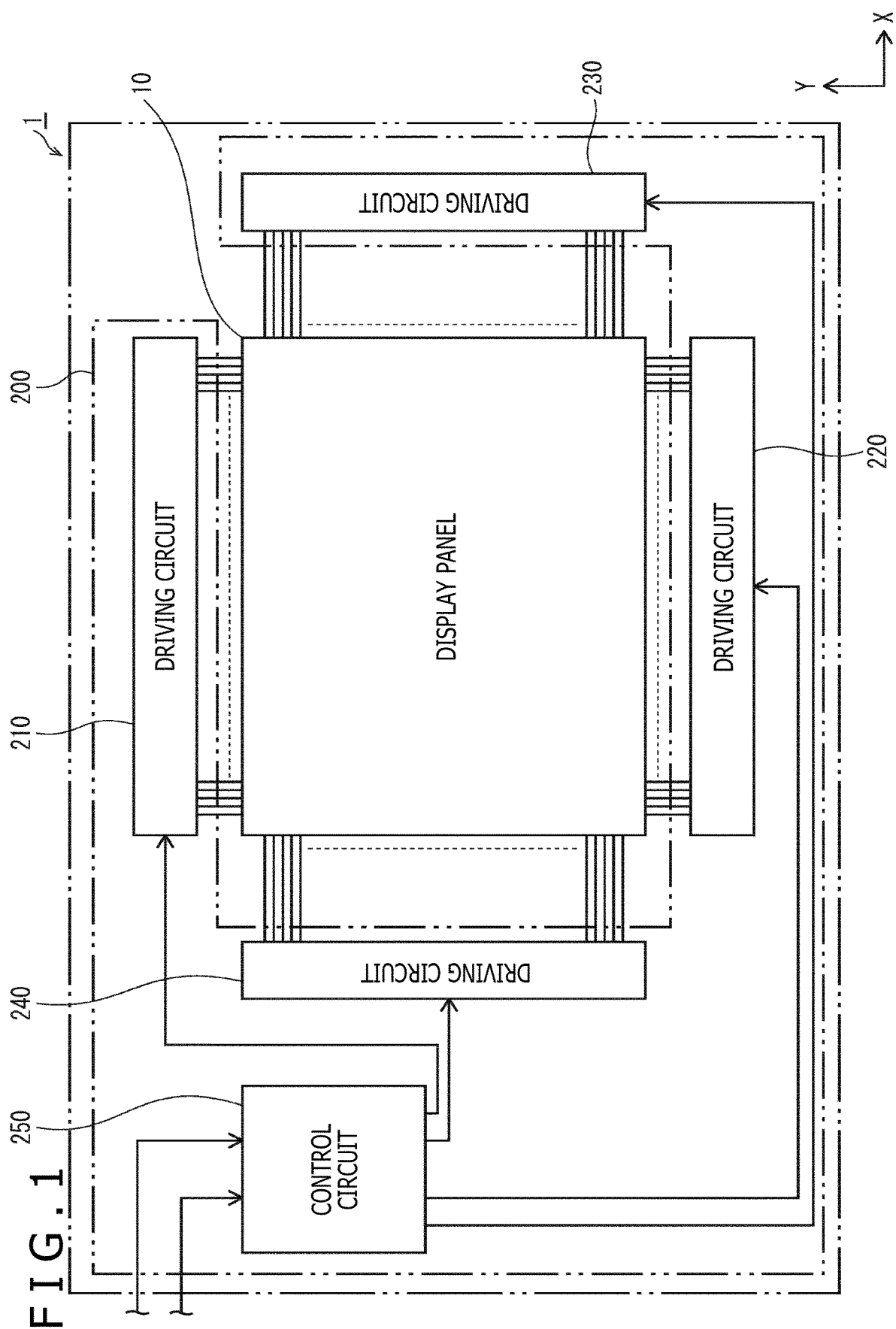
F I G . 1

DISPLAY PANEL WITH OPENING ADJUSTING LAYER

CROSS REFERENCE TO RELATED APPLICATIONS

This application claims priority benefit of Japanese Patent Application No. JP 2019-147390 filed in the Japan Patent Office on Aug. 9, 2019. Each of the above-referenced applications is hereby incorporated herein by reference in its entirety.

BACKGROUND

The present disclosure relates to a display panel using self-luminous elements utilizing an electroluminescence phenomenon or a quantum dot effect and a method of manufacturing the display panel.

Display devices using self-luminous elements such as organic electroluminescence (EL) elements utilizing an electroluminescence phenomenon of an organic material, quantum-dot light emitting diodes (QLEDs) utilizing a quantum dot effect, or the like have recently been spreading.

A self-luminous element has a structure in which at least a light emitting layer is sandwiched between an anode and a cathode. Currently, as a method for forming functional layers including the light emitting layer efficiently, inks including functional materials are applied by a wet process to form the functional layers. The wet process can miniaturize a manufacturing device as compared with a vacuum evaporation device, and eliminates a need to use a shadow mask used when a functional material is evaporated. Therefore, the wet process eliminates a need for work such as alignment of the shadow mask or the like, and facilitates manufacturing of a large-sized substrate such that production of a large-sized panel and a panel size in which mass productivity is taken into consideration are mixed. The wet process thus has characteristics of being suitable for efficient panel production. In addition, unlike an evaporation method, the wet process improves efficiency of usage of a functional material such as an expensive light emitting material or the like, and can therefore reduce panel manufacturing cost. Further, the wet process can deal with a case where film thickness is different for each light emission color by changing an amount of application of ink, and therefore enables various designs without increasing the number of processes.

SUMMARY

In the self-luminous element, design that forms an optical resonator by controlling an optical path length between the anode and a light emission center and an optical path length between the cathode and the light emission center is made to improve light extraction efficiency (see PCT Patent Publication No. WO 2012/17500, for example). On the other hand, the optical path lengths necessary for the optical resonator depend on the wavelength of a light emission color. The larger the wavelength, the longer the optical path lengths. As described above, the evaporation method may need a shadow mask to change the film thickness of a functional layer in each element, whereas the wet process can deal with the change by changing an amount of application of ink. Therefore, controlling the film thickness of a functional layer formed by the wet process is preferable for simplification of manufacturing processes and cost reduction. However, a lower limit amount of ink per unit area is determined by the viscosity of the ink and constraints of a coating device, while an upper limit amount thereof is determined from a viewpoint of suppressing an overflow from partition walls. Thus, there is a limitation to a range in which film thickness can be set in a case where the film thickness of the functional layer is controlled by changing the amount of application of the same ink in the wet process. On the other hand, an ink including a same solute and a same solvent but having a different concentration may need to be handled as another kind of ink in management of manufacturing processes. Therefore, a cost for forming a functional layer having a different film thickness but including the same components may not be minimized.

The present disclosure has been made in view of the above-described problems. It is desirable for the present disclosure to provide a display panel in which functional layers including same components but having different film thicknesses are formed by a wet process and film thickness control can be easily performed using a same ink, and a method of manufacturing the display panel.

A display panel according to one mode of the present disclosure is a display panel in which a plurality of pixel regions are arranged in a matrix form, the display panel including: a substrate; a plurality of pixel electrodes arranged in the plurality of respective pixel regions on the substrate; a partition wall that is disposed between pixel electrodes adjacent to each other in a row direction and extends in a column direction; a first functional layer disposed on or above a pixel electrode within one pixel region and between two partition walls adjacent to each other in the row direction; a first light emitting layer formed on or above the first functional layer; a second functional layer disposed on or above a pixel electrode within another pixel region adjacent in the row direction to the one pixel region and between two partition walls adjacent to each other in the row direction, the second functional layer including a same material as the first functional layer and having a smaller film thickness than a film thickness of the first functional layer; and a second light emitting layer disposed on or above the second functional layer, a wavelength of a light emission color of the second light emitting layer being shorter than a wavelength of a light emission color of the first light emitting layer; as viewed in plan, a ratio of an area of the first functional layer to an area of the pixel region in which the first functional layer is present being lower than a ratio of an area of the second functional layer to an area of the pixel region in which the second functional layer is present.

Here, the pixel region refers to a region occupied by one self-luminous element and elements necessary for the self-luminous element, and includes not only a self-luminous region but also a non-self-luminous region on the periphery of the self-luminous region. That is, in a plurality of self-luminous elements present within one display region, a non-self-luminous region occurring between two self-luminous regions is included in a pixel region related to one of the self-luminous regions.

According to the display panel in the above-described mode, the film thickness of the first functional layer formed in a first gap can be increased easily with respect to the film thickness of the second functional layer formed in a second gap even when a same ink is used. It is therefore possible to realize a display panel in which suitable film thickness control is performed.

BRIEF DESCRIPTION OF THE DRAWINGS

FIG. 1 is a schematic block diagram depicting a circuit configuration of an organic EL display device according to an embodiment;

DETAILED DESCRIPTION OF THE PREFERRED EMBODIMENTS

Figure 2:
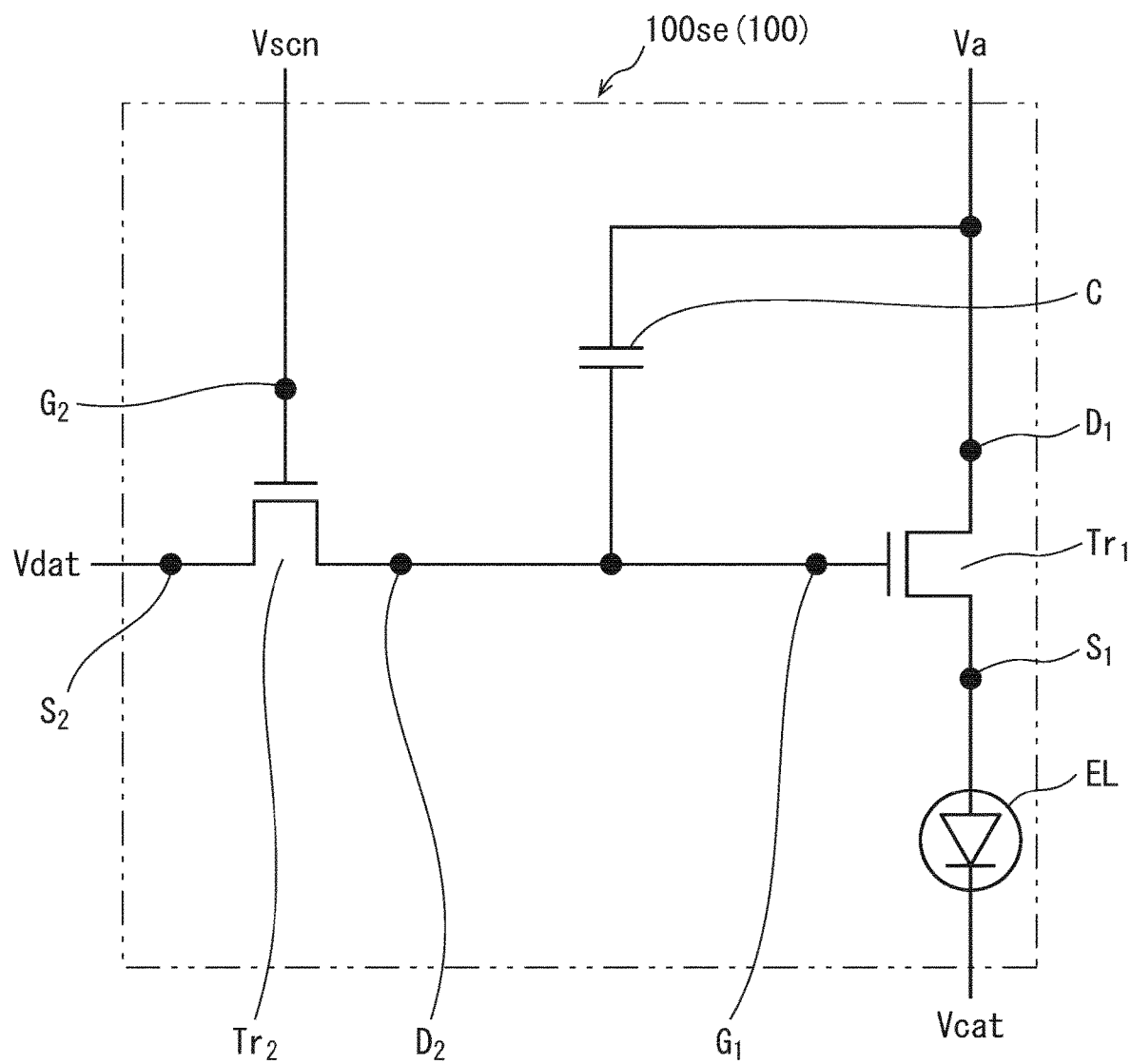
FIG. 2 is a schematic diagram depicting a circuit configuration in each subpixel of a display panel according to the embodiment.

<<Circumstances that LED to One Mode of Present Disclosure>>

An optical resonator structure is known for improving light extraction efficiency of light emitting elements. Specifically, as depicted in the schematic sectional view of FIG.

8B, the optical resonator structure is a structure in which optical path lengths are adjusted such that the following pieces of light strengthen each other: light going through a path $C_1$ in which the light is directly emitted from a light emission center; light going through a path $C_2$ from the light emission center in which path the light is reflected by an optically reflective electrode and then emitted; and light going through a path $C_3$ from the light emission center in which path the light is reflected by an optically transparent electrode and the optically reflective electrode in this order, and then emitted. In this case, an optical path length difference between the path $C_2$ and the path $C_1$ depends on an optical path length of $L_1$ (value obtained by integrating an index of refraction with respect to a path length), and an optical path length difference between the path $C_3$ and the path $C_1$ depends on an optical path length of $L_3$ (=Optical Path Length of $L_1$+Optical Path Length of $L_2$). In this case, a condition for the pieces of light to strengthen each other depends on relation between the optical path length differences and wavelength, and the longer the wavelength of the light to be emitted is, the longer each of the optical path length of $L_1$ and the optical path length of $L_2$ may need to be. On the other hand, functional layers present on a counter electrode side of a light emitting layer, for example, an electron transporting layer, an electron injection layer, and the like in a case where a counter electrode is a cathode can be formed as a common film, and are generally formed by evaporation or the like. Therefore, a shadow mask becomes necessary for film thickness control for each light emission color, and an increase in the number of processes and a decrease in efficiency of usage of a material occur. On the other hand, functional layers present on a pixel electrode side of the light emitting layer, for example, a positive hole transporting layer, a positive hole injection layer, and the like in a case where a pixel electrode is an anode are formed on an element-by-element basis, and are thus suitable for film thickness control for each light emission color.

Functional layers such as the positive hole transporting layer, the positive hole injection layer, and the like can be formed by a coating method. Specifically, an ink in which a material is dissolved is applied to partition wall gaps. In the following, a functional layer thus formed by a coating method will be referred to also as a coating film. The film thickness of the coating film can be adjusted by the concentration of the ink and a dropping amount of the ink per unit area. However, components of functional layers such as the positive hole transporting layer, the positive hole injection layer, and the like often do not need to be changed for each light emission color. In this case, it is desirable to use a same ink from viewpoints of ink management and an improvement in efficiency of a coating device. On the other hand, in a case where the concentration of the ink is fixed, the film thickness of the coating film may need to be adjusted by only the dropping amount of the ink per unit area, and the film thickness of the coating film and the height of the liquid surface of the ink are proportional to each other when the lower surface of the coating film formed is set as a reference. Hence, in a case where the film thickness of the functional layer greatly changes between light emission colors, the height of the liquid surface of the ink when the lower surface of the coating film formed is set as a reference also greatly changes proportionally. Hence, in a light emission color in which the film thickness of the functional layer is large, there may be a risk of an ink overflow because the height of the liquid surface of the ink is too high, whereas in a light emission color in which the film thickness of the functional layer is small, there may be a risk of film thickness uniformity being lost because the height of the liquid surface of the ink is too low, or because intervals between dropping positions of the ink are too wide, for example. As a method for solving this problem, partition walls adjacent to the light emission color in which the film thickness of the functional layer is large may be heightened, for example. However, heightening all partition walls tends to be a cause of film thickness nonuniformity, while changing the height of only a part of the partition walls increases the number of processes. In addition, as another method for solving this problem, the ink concentration may be changed for each light emission color, for example. However, an ink including a same solvent and a same solute but having a different concentration may need to be handled as a different kind of ink in the coating device, thus directly leading to an increase in cost of the coating device and management cost of the ink.

The inventor has studied the structure of a display panel that includes coating films of a same material which coating films have different film thicknesses for respective light emission colors, and in which the coating films can be formed using a same ink, and has arrived at the present disclosure.

<<Modes of Disclosure>>

A display panel according to one mode of the present disclosure is a display panel in which a plurality of pixel regions are arranged in a matrix form, the display panel including: a substrate; a plurality of pixel electrodes arranged in the plurality of respective pixel regions on the substrate; a partition wall that is disposed between pixel electrodes adjacent to each other in a row direction and extends in a column direction; a first functional layer disposed on or above a pixel electrode within one pixel region and between two partition walls adjacent to each other in the row direction; a first light emitting layer formed on or above the first functional layer; a second functional layer disposed on or above a pixel electrode within another pixel region adjacent in the row direction to the one pixel region and between two partition walls adjacent to each other in the row direction, the second functional layer including a same material as the first functional layer and having a smaller film thickness than a film thickness of the first functional layer; and a second light emitting layer disposed on or above the second functional layer, a wavelength of a light emission color of the second light emitting layer being shorter than a wavelength of a light emission color of the first light emitting layer; as viewed in plan, a ratio of an area of the first functional layer to an area of the pixel region in which the first functional layer is present being lower than a ratio of an area of the second functional layer to an area of the pixel region in which the second functional layer is present.

In addition, a method of manufacturing a display panel according to one mode of the present disclosure is a method of manufacturing a display panel in which a plurality of pixel regions are arranged in a matrix form, the method including: preparing a substrate; forming a pixel electrode in each of the plurality of pixel regions on the substrate; forming a partition wall extending in a column direction between pixel electrodes adjacent to each other in a row direction; forming a first functional layer on or above a pixel electrode within one pixel region and between two partition walls adjacent to each other in the row direction; forming a first light emitting layer on or above the first functional layer; forming a second functional layer on or above a pixel electrode within another one pixel region adjacent in the row direction to the one pixel region and between two partition walls adjacent to each other in the row direction by using a same material as the first functional layer, the second functional layer having a smaller film thickness than a film thickness of the first functional layer; and forming a second light emitting layer on or above the second functional layer, a wavelength of a light emission color of the second light emitting layer being shorter than a wavelength of a light emission color of the first light emitting layer; in forming the first functional layer and forming the second functional layer, a ratio of an area of the first functional layer to an area of the pixel region in which the first functional layer is present as viewed in plan being made lower than a ratio of an area of the second functional layer to an area of the pixel region in which the second functional layer is present.

According to the EL display panel in the above-described mode or the manufacturing method in the above-described mode, in the display panel of a so-called line bank type demarcated in the row direction by partition walls, the film thickness of the first functional layer formed in a first gap can be increased easily with respect to the film thickness of the second functional layer formed in a second gap even when a same ink is used. It is therefore possible to realize a display panel in which suitable film thickness control is performed.

In addition, the EL display panel according to the above-described mode or the manufacturing method in the above-described mode may be as follows.

The display panel may further include: an inter-pixel regulating layer disposed between pixel electrodes adjacent to each other in the column direction and extending in the row direction; and an opening adjusting layer disposed on the pixel electrode in the pixel region in which the first functional layer is present, the opening adjusting layer having an upper surface at a height equal to or less than a height of the inter-pixel regulating layer when the substrate is set as a reference; in which the area of the first functional layer may be smaller than the area of the pixel region due to absence of the first functional layer on or above the opening adjusting layer.

In addition, before the partition wall is formed after the pixel electrode is formed, an inter-pixel regulating layer extending in the row direction may be formed between pixel electrodes adjacent to each other in the column direction, before the partition wall is formed after the pixel electrode is formed, an opening adjusting layer having an upper surface at a height equal to or less than a height of the inter-pixel regulating layer when the substrate is set as a reference may be formed on the pixel electrode in the pixel region in which the first functional layer is present, and the area of the first functional layer with respect to the area of the pixel region may be reduced by not forming the first functional layer on or above the opening adjusting layer in forming the first functional layer.

Thus, while the area in which the first functional layer is formed is reduced by the area of the opening adjusting layer in the pixel region in which the first functional layer is present, an ink including a material for the first functional layer can be applied onto or above the opening adjusting layer in the process of forming the first functional layer. It is therefore possible to increase the film thickness of the first functional layer easily without heightening the liquid surface of the ink including the material for the first functional layer in the pixel region in which the first functional layer is present.

In addition, the display panel can further include: an inter-pixel regulating layer disposed between pixel electrodes adjacent to each other in the column direction and extending in the row direction; and an opening adjusting layer disposed so as to extend on the pixel electrode from the inter-pixel regulating layer in the pixel region in which the first functional layer is present, the opening adjusting layer having an upper surface at a height lower than a height of the inter-pixel regulating layer when the substrate is set as a reference; in which the area of the first functional layer can be smaller than the area of the pixel region due to absence of the first functional layer on or above the opening adjusting layer.

In addition, before the partition wall is formed after the pixel electrode is formed, an inter-pixel regulating layer extending in the row direction can be formed between pixel electrodes adjacent to each other in the column direction, before the partition wall is formed after the pixel electrode is formed, an opening adjusting layer having an upper surface at a height lower than a height of the inter-pixel regulating layer when the substrate is set as a reference can be formed so as to extend on the pixel electrode from the inter-pixel regulating layer in the pixel region in which the first functional layer is present, and the area of the first functional layer with respect to the area of the pixel region can be reduced by not forming the first functional layer on or above the opening adjusting layer in forming the first functional layer.

Thus, while the area in which the first functional layer is formed is reduced by the area of the opening adjusting layer in the pixel region in which the first functional layer is present, an ink including a material for the first functional layer can be applied onto or above the opening adjusting layer in the process of forming the first functional layer. It is therefore possible to increase the film thickness of the first functional layer easily without heightening the liquid surface of the ink including the material for the first functional layer in the pixel region in which the first functional layer is present.

In addition, the opening adjusting layer and the inter-pixel regulating layer can include a same material.

In addition, the formation of the opening adjusting layer and the formation of the inter-pixel regulating layer can be performed by using a same material.

Thus, the opening adjusting layer and the inter-pixel regulating layer can be formed at the same time, so that manufacturing processes can be simplified.

In addition, the display panel can further include an inter-pixel regulating layer disposed between pixel electrodes adjacent to each other in the column direction and extending in the row direction, in which a width in the column direction of a part of the inter-pixel regulating layer, the part straddling the pixel region in which the first functional layer is present and a pixel region adjacent in the column direction to the pixel region, can be larger than a width in the column direction of a part of the inter-pixel regulating layer, the part straddling the pixel region in which the second functional layer is present and a pixel region adjacent in the column direction to the pixel region, and the area of the first functional layer can be smaller than the area of the pixel region due to absence of the first functional layer on or above the inter-pixel regulating layer.

In addition, before the partition wall is formed after the pixel electrode is formed, an inter-pixel regulating layer extending in the row direction can be formed between pixel electrodes adjacent to each other in the column direction, in forming the inter-pixel regulating layer, a width in the column direction of a part of the inter-pixel regulating layer, the part straddling the pixel region in which the first functional layer is present and a pixel region adjacent in the column direction to the pixel region, can be made larger than a width in the column direction of a part of the inter-pixel regulating layer, the part straddling the pixel region in which the second functional layer is present and a pixel region adjacent in the column direction to the pixel region, and the area of the first functional layer with respect to the area of the pixel region can be reduced by not forming the first functional layer on or above the inter-pixel regulating layer.

Thus, the ratio of the opening adjusting layer in the pixel region in which the first functional layer is present is higher than in the pixel region in which the second functional layer is present. The ratio of the area of the first functional layer to the area of the pixel region can therefore be made lower than the ratio of the area of the second functional layer to the area of the pixel region easily by not forming the first functional layer on or above the opening adjusting layer.

In addition, the pixel electrode can be an anode, and the first functional layer can have at least one or more of a positive hole injection function and a positive hole transporting function.

Efficiency of self-luminous elements can be thereby improved.

In addition, the first functional layer and the second functional layer can be a coating film.

In addition, the formation of the first functional layer and the formation of the second functional layer can be performed by applying and drying a same ink.

Thus, the first functional layer and the second functional layer including same components and having different film thicknesses can be formed easily by a same coating process.

In addition, a display panel according to one mode of the present disclosure is a display panel in which a plurality of pixel region columns arranged in a staggered manner are provided over a plurality of columns, the display panel including: a substrate; a plurality of pixel electrodes arranged in a plurality of respective pixel regions on the substrate; a partition wall disposed between pixel region columns adjacent to each other; a first functional layer disposed on or above a pixel electrode within one pixel region; a first light emitting layer formed on or above the first functional layer; a second functional layer disposed on or above a pixel electrode within a pixel region in a pixel region column different from a pixel region column of the one pixel region, the second functional layer including a same material as the first functional layer and having a smaller film thickness than a film thickness of the first functional layer; and a second light emitting layer disposed on or above the second functional layer, a wavelength of a light emission color of the second light emitting layer being shorter than a wavelength of a light emission color of the first light emitting layer; as viewed in plan, a ratio of an area of the first functional layer to an area of the pixel region in which the first functional layer is present being lower than a ratio of an area of the second functional layer to an area of the pixel region in which the second functional layer is present.

In addition, a method of manufacturing a display panel according to one mode of the present disclosure is a method of manufacturing a display panel in which a plurality of pixel region columns arranged in a staggered manner are provided over a plurality of columns, the method including: preparing a substrate; forming a pixel electrode in each of a plurality of pixel regions on the substrate; forming a partition wall between pixel region columns adjacent to each other; forming a first functional layer on or above a pixel electrode within one pixel region; forming a first light emitting layer on or above the first functional layer; forming a second functional layer on or above a pixel electrode within a pixel region in a pixel region column different from a pixel region column of the one pixel region by using a same material as the first functional layer, the second functional layer having a smaller film thickness than a film thickness of the first light emitting layer; and forming a second light emitting layer on or above the second functional layer, a wavelength of a light emission color of the second light emitting layer being shorter than a wavelength of a light emission color of the first light emitting layer; in forming the first functional layer and forming the second functional layer, a ratio of an area of the first functional layer to an area of the pixel region in which the first functional layer is present as viewed in plan being made lower than a ratio of an area of the second functional layer to an area of the pixel region in which the second functional layer is present.

Thus, the display panel in which pixel regions are arranged in a staggered manner and the method of manufacturing the display panel also produce the same effects as the display panel according to one mode of the present disclosure and the method of manufacturing the display panel.

In addition, a display panel according to one mode of the present disclosure is a display panel in which a plurality of pixel region columns are provided over a plurality of columns, the display panel including: a substrate; a plurality of pixel electrodes arranged in a plurality of respective pixel regions on the substrate; a partition wall surrounding each pixel region; an inter-pixel regulating layer and a first functional layer arranged so as not to overlap each other as viewed in plan within one pixel region; a first light emitting layer formed on or above the first functional layer; a second functional layer disposed within a pixel region in a pixel region column different from a pixel region column of the one pixel region, the second functional layer including a same material as the first functional layer and having a smaller film thickness than a film thickness of the first functional layer; and a second light emitting layer disposed on or above the second functional layer, a wavelength of a light emission color of the second light emitting layer being shorter than a wavelength of a light emission color of the first light emitting layer; as viewed in plan, a ratio of an area of the first functional layer to an area of the pixel region in which the first functional layer is present being lower than a ratio of an area of the second functional layer to an area of the pixel region in which the second functional layer is present.

In addition, a method of manufacturing a display panel according to one mode of the present disclosure is a method of manufacturing a display panel in which a plurality of pixel region columns are provided over a plurality of columns, the method including: preparing a substrate; forming a pixel electrode in each of a plurality of pixel regions on the substrate; forming a partition wall surrounding each pixel region; forming an inter-pixel regulating layer and a first functional layer so as not to overlap each other as viewed in plan within one pixel region; forming a first light emitting layer on or above the first functional layer; forming a second functional layer within a pixel region in a pixel region column different from a pixel region column of the one pixel region by using a same material as the first functional layer, the second functional layer having a smaller film thickness than a film thickness of the first light emitting layer; and forming a second light emitting layer on or above the second functional layer, a wavelength of a light emission color of the second light emitting layer being shorter than a wavelength of a light emission color of the first light emitting layer; in forming the first functional layer and forming the second functional layer, a ratio of an area of the first functional layer to an area of the pixel region in which the first functional layer is present as viewed in plan being made lower than a ratio of an area of the second functional layer to an area of the pixel region in which the second functional layer is present.

Thus, the display panel of a so-called pixel bank type demarcated into each pixel region by the partition wall and the method of manufacturing the display panel also produce the same effects as the display panel according to one mode of the present disclosure and the method of manufacturing the display panel.

First Embodiment

1. Configuration of Display Device

Description will hereinafter be made of an embodiment of a display device using an organic EL display panel as a self-luminous display panel according to the present disclosure (which display device will hereinafter be referred to simply as a "display device").

(1) Circuit Configuration of Display Device 1

FIG. 1 is a block diagram depicting a circuit configuration of a display device 1.

As depicted in FIG. 1, the display device 1 includes an organic EL display panel 10 (hereinafter referred to as a "display panel 10") and a driving control circuit unit 200 connected to the display panel 10.

The display panel 10 is an organic electroluminescence (EL) panel utilizing an electroluminescence phenomenon of an organic material. The display panel 10 is formed by arranging a plurality of organic EL elements in the form of a matrix (matrix manner), for example.

The driving control circuit unit 200 includes four driving circuits 210 to 240 and a control circuit 250.

(2) Circuit Configuration of Display Panel 10

In the display panel 10, a plurality of unit pixels 100e are arranged in the form of a matrix to constitute a display region. Each of the unit pixels 100e includes three organic EL elements, that is, three subpixels 100se for emitting light in three colors of red (R), green (G), and blue (B). A circuit configuration of each subpixel 100se will be described with reference to FIG. 2.

FIG. 2 is a circuit diagram depicting a circuit configuration in an organic EL element 100 corresponding to each subpixel 100se of the display panel 10 used in the display device 1.

As depicted in FIG. 2, in the display panel 10 according to the present embodiment, each subpixel 100se includes two transistors $Tr_1$ and $Tr_2$, one capacitor C, and an organic EL element portion EL as a light emitting portion. The transistor $Tr_1$ is a driving transistor. The transistor $Tr_2$ is a switching transistor.

A gate $G_2$ of the switching transistor $Tr_2$ is connected to a scanning line Vscn. A source $S_2$ of the switching transistor $Tr_2$ is connected to a data line Vdat. A drain $D_2$ of the switching transistor $Tr_2$ is connected to a gate $G_1$ of the driving transistor $Tr_1$.

A drain $D_1$ of the driving transistor $Tr_1$ is connected to a power supply line Va. A source $S_1$ of the driving transistor $Tr_1$ is connected to a pixel electrode (anode) of the organic EL element portion EL. A common electrode (counter electrode: cathode) in the organic EL element portion EL is connected to a ground line Vcat.

Incidentally, a first terminal of the capacitor C is connected to the drain $D_2$ of the switching transistor $Tr_2$ and the gate $G_1$ of the driving transistor $Tr_1$. A second terminal of the capacitor C is connected to the power supply line Va.

In the display panel 10, one unit pixel 100e is formed by combining a plurality of subpixels 100se (for example, three subpixels 100se having light emission colors of red (R), green (G), and blue (B)) adjacent to each other, and unit pixels 100e are arranged so as to be distributed and constitute pixel regions.

Each gate line is drawn out from the gate $G_2$ of each subpixel 100se, and is connected to the scanning line Vscn connected from the outside of the display panel 10. Similarly, each source line is drawn out from the source $S_2$ of each subpixel 100se, and is connected to the data line Vdat connected from the outside of the display panel 10.

In addition, the power supply line Va of each subpixel 100se and the ground line Vcat of each subpixel 100se are integrated and connected to a power supply line and a ground line of the display device 1.

Incidentally, the driving circuit of each organic EL element is not limited to the above, but may be of another configuration.

(3) General Configuration of Display Panel 10

(3-1) Outline of Display Panel 10

The display panel 10 according to the present embodiment will be described with reference to drawings. Incidentally, the drawings are schematic diagrams, and the scale thereof may be different from an actual scale.

Figure 3:
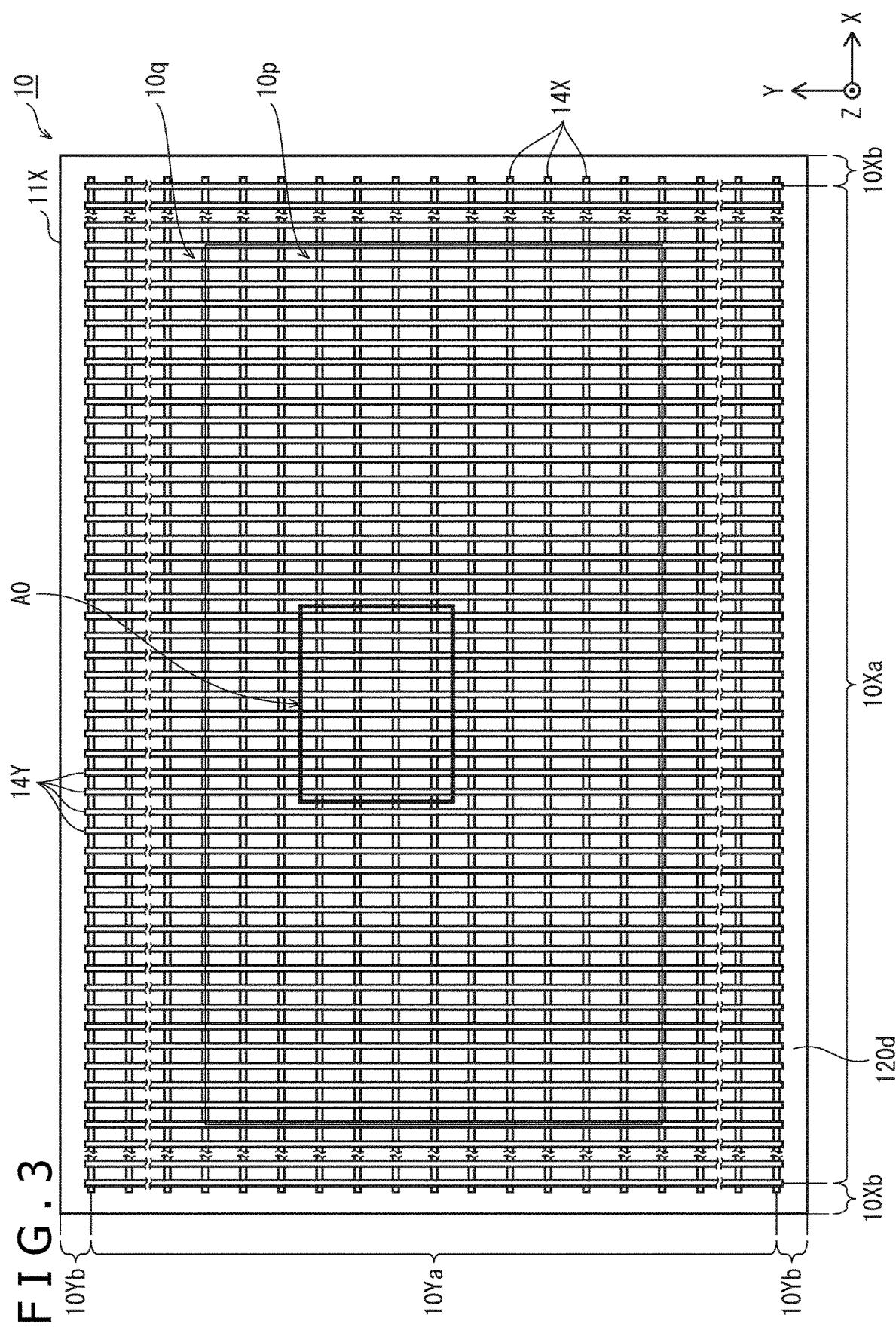
FIG. 3 is a schematic plan view of the display panel according to the embodiment.

FIG. 3 is a schematic plan view of the display panel 10. The display panel 10 is an organic EL display panel utilizing an electroluminescence phenomenon of an organic compound. The display panel 10 has a top emission type configuration emitting light from a top surface in which configuration a plurality of organic EL elements 100 each constituting a pixel are arranged in the form of a matrix on a substrate 11 (TFT substrate) in which thin film transistors (TFT: Thin Film Transistor) are formed. Here, in the present specification, an X-direction, a Y-direction, and a Z-direction in FIG. 3 will be respectively set as a row direction, a column direction, and a thickness direction in the display panel 10.

As depicted in FIG. 3, the display panel 10 includes: a demarcated region 10a (10Xa and 10Ya in the X-direction and the Y-direction, respectively, or 10a when distinction therebetween is not necessary) having column banks 14Y (partition walls) and row banks 14X (inter-pixel regulating layers) arranged therein which demarcate the plurality of organic EL elements 100 on the substrate 11 into the form of a matrix and regulate light emission units of respective colors of RGB; and a non-demarcated region 10b (10Xb and 10Yb in the X-direction and the Y-direction, respectively, or 10b when distinction therebetween is not necessary) on the periphery of the demarcated region 10a. An outer peripheral edge in the column direction of the demarcated region 10a corresponds to end portions in the column direction of the column banks 14Y. A rectangular sealing member (not depicted) surrounding the demarcated region 10a is formed in the non-demarcated region 10b. Of regions demarcated by the column banks 14Y and the row banks 14X in the demarcated region 10a, a non-display region 10q including an outer peripheral portion does not contribute to display, but the organic EL elements 100 are formed in a display region 10p provided on the inside of the non-display region 10q. Incidentally, organic EL elements do not have to be formed in the non-display region 10q, but organic EL elements may be formed in the non-display region 10q.

(3-2) Outline of Organic EL Element 100

Figure 4:
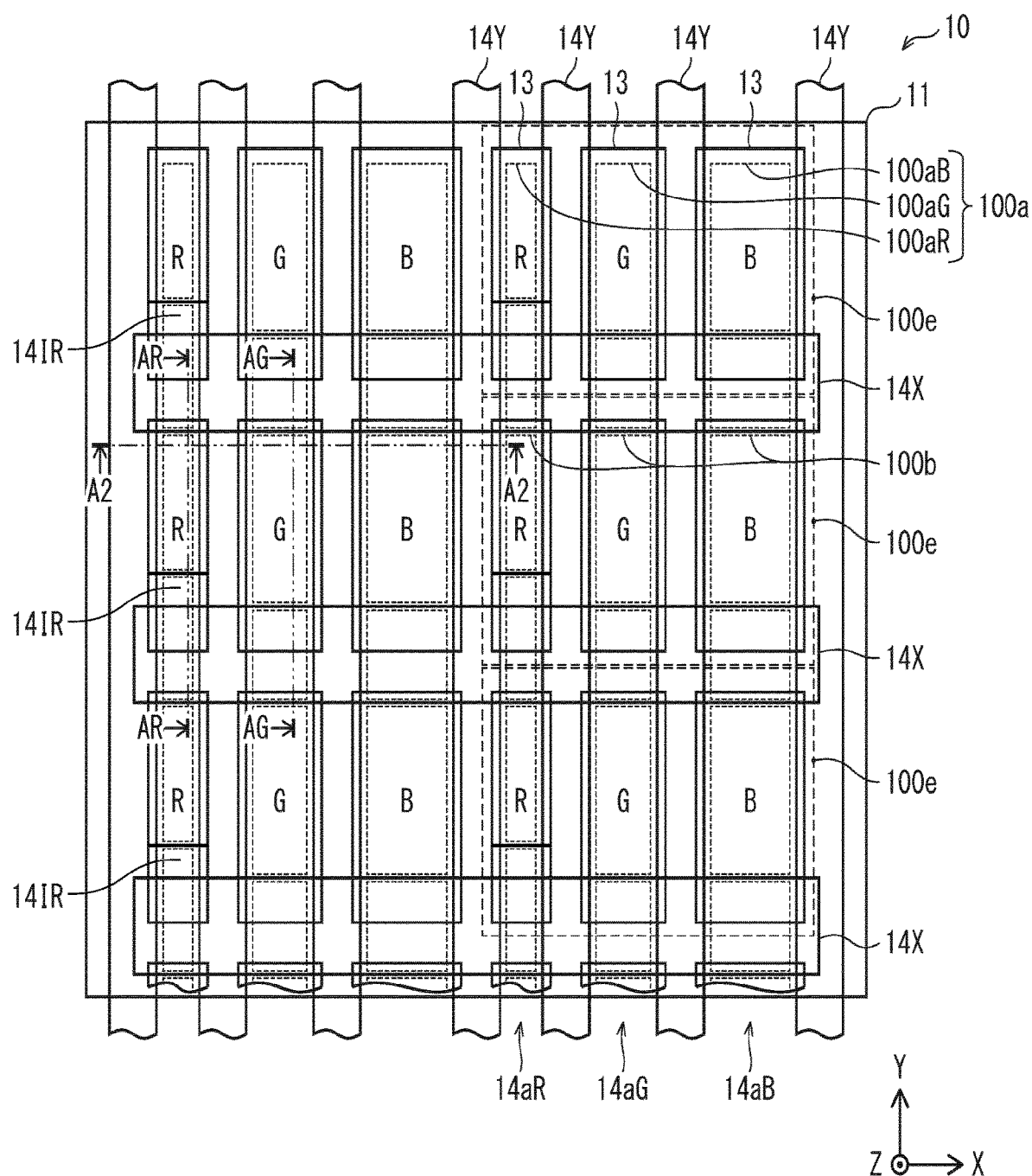
FIG. 4 is an enlarged plan view of a portion A0 in FIG. 3.

FIG. 4 is an enlarged plan view of a portion A0 in FIG. 3.

In the display region 10p of the display panel 10, unit pixels (pixel regions) 100e constituted of a plurality of organic EL elements 100 are closely arranged in the form of a matrix. Each unit pixel 100e includes, as subpixels 100se, three kinds of self-luminous elements, that is, a self-luminous element 100R for emitting light in red, a self-luminous element 100G for emitting light in green, and a self-luminous element 100B for emitting light in blue. That is, the self-luminous elements 100R, 100G, and 100B arranged in the row direction form one set, and constitute a unit pixel 100e in color display. The self-luminous elements 100R, 100G, and 100B respectively include a self-luminous region 100aR for emitting light in red, a self-luminous region 100aG for emitting light in green, and a self-luminous region 100aB for emitting light in blue (which self-luminous regions will hereinafter be abbreviated to "self-luminous regions 100a" when 100aR, 100aG, and 100aB are not distinguished from each other) and non-self-luminous regions 100b.

In the display panel 10, a plurality of pixel electrodes 13 are arranged in the form of a matrix in a state of being separated from one another by a predetermined distance in each of the row and column directions on the substrate 11. Three pixel electrodes 13 and a region to the periphery thereof are included in a unit pixel (pixel region) 100e. A boundary between the unit pixel 100e and a unit pixel 100e is a straight line dividing a gap between pixel electrodes 13 adjacent to each other in the column direction (Y-direction) into two parts in the Y-direction and a straight line dividing a gap between the pixel electrodes 13 of self-luminous elements 100B and 100R adjacent to each other in the row direction (X-direction) into two parts in the X-direction.

A pixel electrode 13 and a pixel electrode 13 adjacent thereto are insulated from each other. An insulating layer extending in a line shape in the form of an insulating layer is provided between the pixel electrodes 13 adjacent to each other.

Column banks 14Y each extending in the column direction (Y-direction in FIG. 3) are arranged in parallel with each other in a plurality of columns on regions on the substrate 11 which regions are located between one pixel electrode 13 and pixel electrodes 13 adjacent thereto in the row direction. Therefore, a row direction outer edge of a self-luminous region 100a is defined by a row direction outer edge of a column bank 14Y.

On the other hand, row banks 14X each extending in the row direction (X-direction in FIG. 3) are arranged in parallel with each other in a plurality of rows on regions on the substrate 11 which regions are located between one pixel electrode 13 and pixel electrodes 13 adjacent thereto in the column direction. Regions in which the row banks 14X are formed are non-self-luminous regions 100b because light emitting layers 17 above the pixel electrodes 13 do not produce organic electroluminescence in the regions. Therefore, an outer edge in the column direction of a self-luminous region 100a is defined by a column direction outer edge of a row bank 14X. Incidentally, as for a red light emitting element 100R, an opening adjusting layer 14IR is provided on a pixel electrode 13R in addition to the row bank 14X, and a region above the opening adjusting layer 14IR in a light emitting layer 17R above the pixel electrode 13R is also a non-self-luminous region 100b.

Incidentally, a configuration is assumed here in which the pixel electrodes 13 have the same shapes for all of the subpixels, and a part of a pixel electrode 13 is covered by a row bank 14X, a column bank 14Y, and an opening adjusting layer 14I. However, the part covered by the row bank 14X, the column bank 14Y, and the opening adjusting layer 14I is a part that does not function as an electrode, and therefore the pixel electrode 13 may not be formed in a part to be covered by the row bank 14X, the column bank 14Y, or the opening adjusting layer 14I.

When a part between column banks 14Y adjacent to each other is defined as a gap 14a, there are, as the gap 14a, a red gap 14aR corresponding to the self-luminous region 100aR, a green gap 14aG corresponding to the self-luminous region 100aG, and a blue gap 14aB corresponding to the self-luminous region 100aB (the gap 14aR, the gap 14aG, and the gap 14aB will hereinafter be referred to as the "gap 14a" when not distinguished from each other), and the display panel 10 adopts a configuration in which large numbers of column banks 14Y and gaps 14a are alternately arranged.

In the display panel 10, a plurality of pixel regions 100e are arranged in alignment in the column direction along the gap 14aR, the gap 14aG, and the gap 14aB such that self-luminous regions 100a and non-self-luminous regions 100b are alternately repeated. In a non-self-luminous region 100b, there is a connecting recessed portion (contact hole, not depicted) that connects the pixel electrode 13 and the source $S_1$ of the TFT to each other, and a contact region on the pixel electrode 13 for electric connection to the pixel electrode 13 is provided.

In one subpixel 100se, a column bank 14Y disposed in the column direction and a row bank 14X disposed in the row direction are orthogonal to each other, and a self-luminous region 100a is located between the row bank 14X and a row bank 14X adjacent to this row bank 14X in the column direction.

Figure 5:
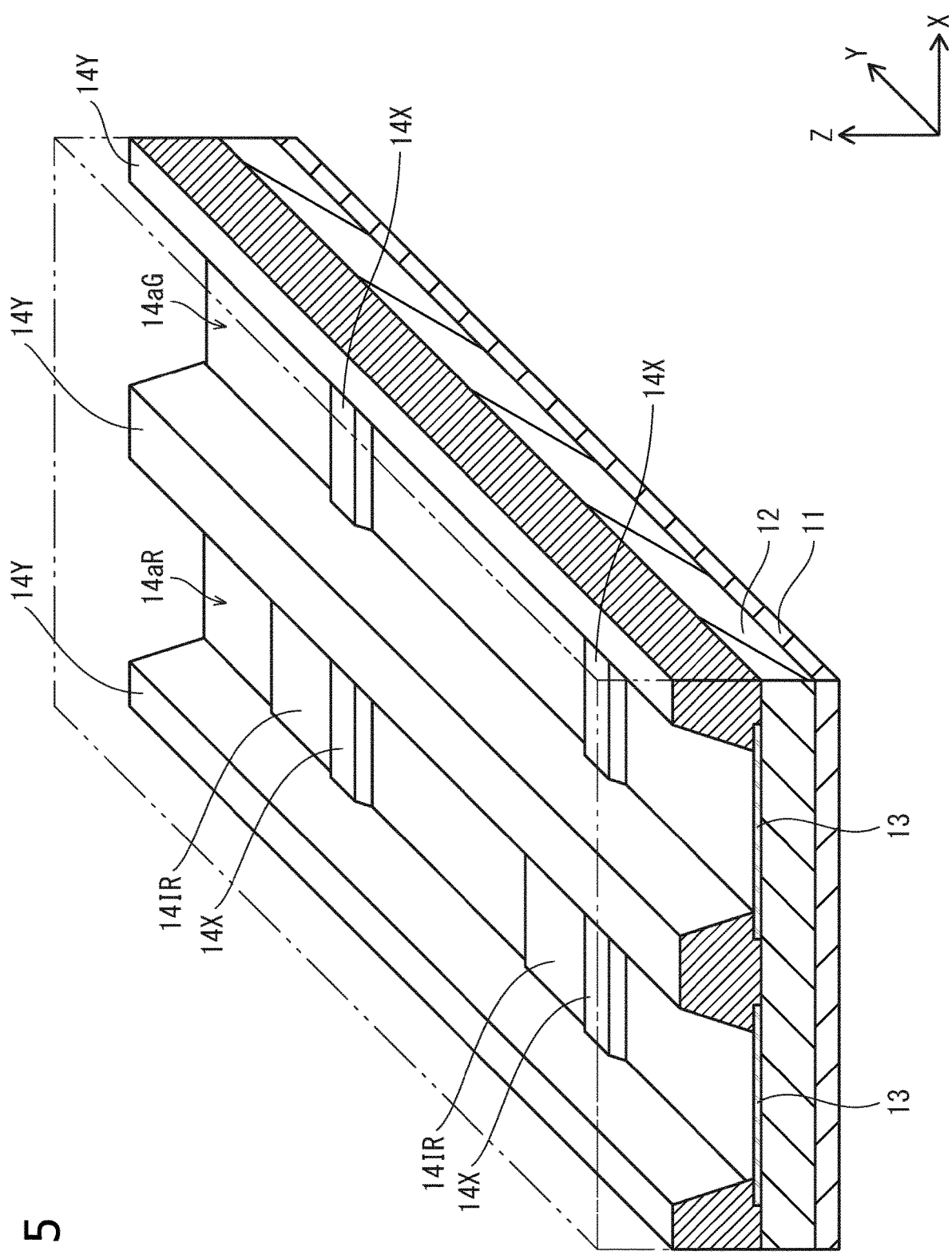
FIG. 5 is a perspective view of a part of a substrate in a stage in which column banks, row banks, and opening adjusting layers are formed.

FIG. 5 is a perspective view of a part of the display panel 10 described above, the perspective view being of assistance in explaining a state of formation of column banks 14Y and row banks 14X. As depicted in the figure, the height of the row banks 14X is sufficiently lower than the height of the column banks 14Y (line bank type). Incidentally, the height of opening adjusting layers 14IR is the same as the height of the row banks 14X, or is lower than the height of the row banks 14X. Incidentally, a region inclining in a direction of approaching a self-luminous region 100a may be present as at least a part of the upper surface of an opening adjusting layer 14IR. For example, the upper surface of the opening adjusting layer 14IR may be parallel with the top surface of the pixel electrode 13, or a part or the whole of the upper surface of the opening adjusting layer 14IR may be inclined so as to become lower toward the self-luminous region 100a.

Due to the above-described configuration, the liquid surface of an ink discharged into each of the gaps 14aR, 14aG, and 14aB is higher than the row bank 14X and the opening adjusting layer 14IR, and the ink flows in the column direction (Y-direction). Thus, the liquid surface of the ink is flattened, and variations in the column direction in film thickness are reduced.

(3-3) Configuration of Parts of Display Panel 10

Figure 6A:
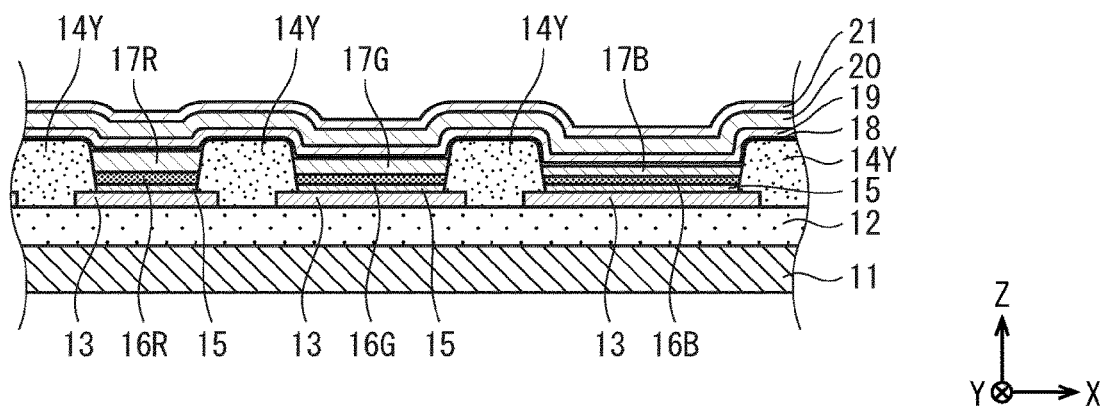
FIG. 6A is a schematic sectional view taken along a line A2-A2 in FIG. 4.
Figure 6B:
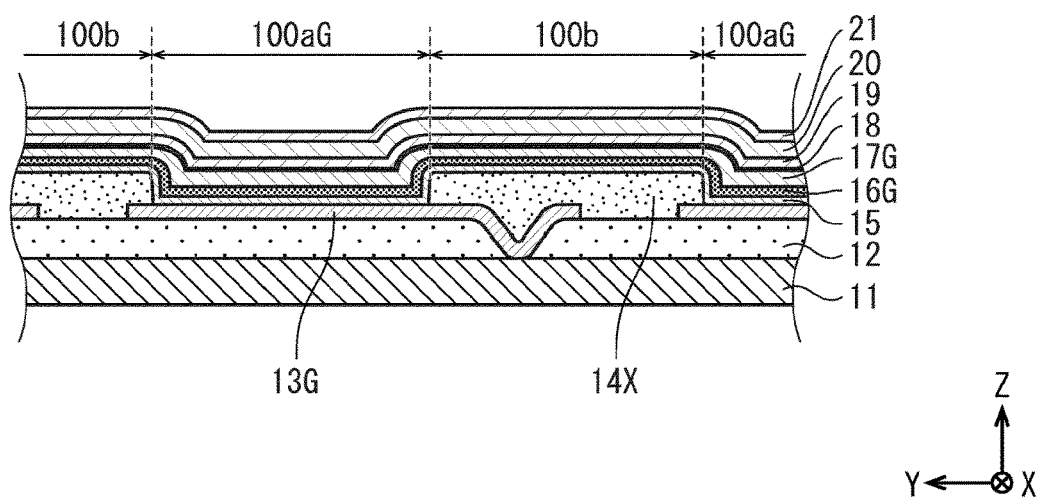
FIG. 6B is a schematic sectional view taken along a line AG-AG in FIG. 4.
Figure 6C:
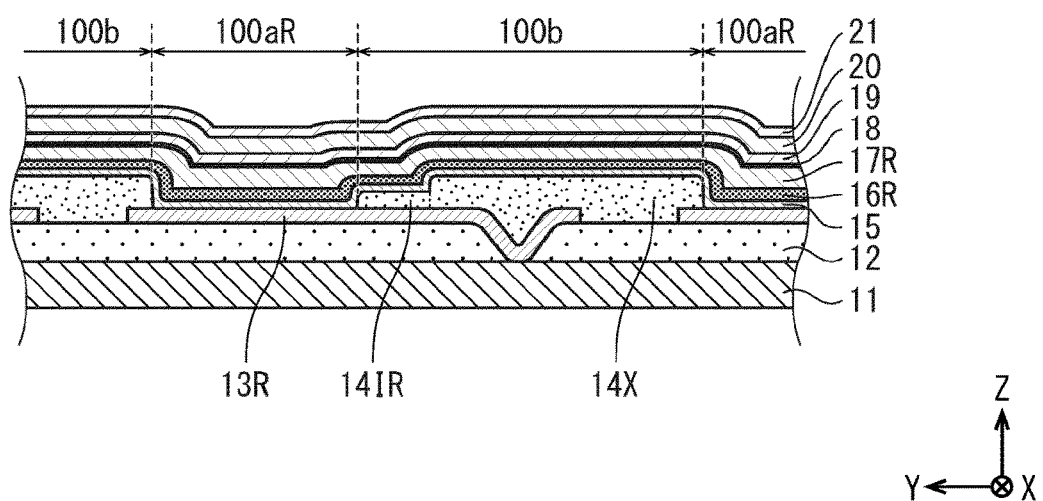
FIG. 6C is a schematic sectional view taken along a line AR-AR in FIG. 4.

A configuration of parts of the display panel 10 will be described in the following. FIG. 6A is a sectional schematic view corresponding to a section A2-A2 in FIG. 4. FIG. 6B is a sectional schematic view corresponding to a section AG-AG in FIG. 4. FIG. 6C is a sectional schematic view corresponding to a section AR-AR in FIG. 4.

<Substrate>

The substrate 11 includes a base material 111 as an insulating material and a thin film transistor (TFT) layer 112. A driving circuit is formed for each pixel in the TFT layer 112. A glass substrate, a quartz substrate, a plastic substrate, or the like, for example, can be adopted as the base material 111. Either of a thermoplastic resin and a thermosetting resin may be used as a plastic material. For example, the following are cited: polyimide (PI), polyetherimide (PEI), polysulfone (PSu), polycarbonate (PC), polyethylene terephthalate (PET), polyethylene naphthalate (PEN), polybutylene terephthalate, styrene-based, polyolefin-based, polyurethane-based, and various other thermoplastic elastomers, epoxy resins, unsaturated polyester, silicone resin, polyurethane, or the like, or copolymers composed mainly thereof, blends, polymer alloys, and the like. A selection is made from these so as to have durability against a process temperature, and one kind or a laminate obtained by laminating two kinds or more can be used.

<Interlayer Insulating Layer>

An interlayer insulating layer 12 is formed on the substrate 11. The interlayer insulating layer 12 includes a resin material. The interlayer insulating layer 12 is to flatten differences in level of the upper surface of the TFT layer 112. A positive photosensitive material, for example, is cited as the resin material. In addition, an acrylic-based resin, a polyimide-based resin, a siloxane-based resin, a phenol-based resin, or the like is cited as such a photosensitive material. In addition, as depicted in FIG. 6B and FIG. 6C, a contact hole is formed for each pixel in the interlayer insulating layer 12.

<Pixel Electrode>

A pixel electrode 13 is formed on the interlayer insulating layer 12. The pixel electrode 13 is provided for each pixel, and is electrically connected to the TFT layer 112 through the contact hole provided in the interlayer insulating layer 12.

In the present embodiment, the pixel electrode 13 functions as an anode having light reflectivity.

Concrete examples of a metallic material having light reflectivity include Ag (silver), Al (aluminum), aluminum alloys, Mo (molybdenum), APC (alloy of silver, palladium, and copper), ARA (alloy of silver, rubidium, and gold), MoCr (alloy of molybdenum and chromium), MoW (alloy of molybdenum and tungsten), NiCr (alloy of nickel and chromium), and the like.

While the pixel electrode 13 may be formed by a single metallic layer, the pixel electrode 13 may also be of a laminated structure obtained by laminating a layer made of a metallic oxide such as ITO (indium tin oxide) or IZO (indium zinc oxide) onto the metallic layer.

Incidentally, the pixel electrode 13 may function as an optically transparent anode. In this case, the pixel electrode 13 includes at least one of a metallic layer formed by a metallic material and a metallic oxide layer formed by a metallic oxide. Materials for the metallic layer include, for example, Ag, a silver alloy including Ag as a main component, Al, and an Al alloy including Al as a main component. A magnesium-silver alloy (MgAg) and an indium-silver alloy are cited as the Ag alloy. Ag basically has a low resistivity. The Ag alloy is excellent in heat resistance and corrosion resistance, and is preferable in that the Ag alloy can maintain excellent electrical conductivity over a long period of time. A magnesium-aluminum alloy (MgAl) and a lithium-aluminum alloy (LiAl) are cited as the Al alloy. Other alloys include a lithium-magnesium alloy and a lithium-indium alloy. In order to ensure transparency, the film thickness of the metallic layer is substantially 1 nm to 50 nm. Materials for the metallic oxide layer include, for example, ITO (indium tin oxide) and IZO (indium zinc oxide). Also in this case, the pixel electrode 13 may be formed by a single metallic layer or a single metallic oxide layer. However, the pixel electrode 13 may also be of a laminated structure obtained by laminating a metallic oxide layer onto a metallic layer or a laminated structure obtained by laminating a metallic layer onto a metallic oxide layer. Further, in the case of the present configuration, at least a part of the substrate 11 which part is located on the lower side of the pixel electrode 13 may need to have transparency.

Incidentally, as described above, the pixel electrode 13 may not be formed in a part corresponding to a part or the whole of the region covered by the column bank 14Y, the opening adjusting layer 14I, and the row bank 14X. However, in order to function as the pixel electrode, a part functioning as the pixel electrode may need to be electrically connected to the TFT.

<Column Banks 14Y>

Column banks 14Y are formed on the pixel electrode 13 in a state in which the column banks 14Y expose a partial region of the upper surface of the pixel electrode 13 and cover a region on the periphery of the partial region. The region not covered by the column banks 14Y in the upper surface of the pixel electrode 13 (which region will hereinafter be referred to as an "opening portion") corresponds to a subpixel. That is, the column banks 14Y have a gap 14a provided for each subpixel.

In parts in which the pixel electrode 13 is not formed, the column banks 14Y are formed on the interlayer insulating layer 12. That is, in the parts in which the pixel electrode 13 is not formed, the bottom surfaces of the column banks 14Y are in contact with the upper surface of the interlayer insulating layer 12.

The column banks 14Y function as a structure for preventing an applied ink from coming into contact with the ink of an adjacent subpixel when a positive hole injection layer 15, a positive hole transporting layer 16, and a light emitting layer 17 are formed by a coating method. A top portion of a column bank 14Y and an upper portion of a side wall portion continuous with the top portion are a liquid repellent part, and a part of the side wall portion excluding the liquid repellent part is a lyophilic part. The column banks 14Y are formed by adding a liquid repellent surface-active agent such as a fluorine-based compound, a silicone-based compound, or the like to a base material including an insulative resin material. A positive photosensitive material, for example, can be used as the base material, which is an insulative resin material. Specifically, an acrylic-based resin, a polyimide-based resin, a siloxane-based resin, a phenol-based resin, and the like are cited as the base material. Incidentally, the base material is not limited to the positive photosensitive material. A negative photosensitive material, for example, may be used as the base material, or a non-photosensitive material may be used as the base material.

The column banks 14Y each have a truncated quadrangular pyramidal shape or a shape similar thereto. The column banks 14Y each have a cross section in a forward tapered trapezoidal shape tapered upward or an upwardly projecting cup shape.

<Row Banks 14X>

Row banks 14X are formed on the pixel electrode 13 in a state in which the row banks 14X expose a partial region of the upper surface of the pixel electrode 13 and cover a region on the periphery of the partial region. A direction in which the row banks 14X extend is orthogonal to a direction in which the column banks 14Y extend. Each of the row banks 14X is formed so as to span a plurality of gaps 14a, and demarcates pixel electrodes 13 adjacent to each other within the gaps 14a.

In the present embodiment, in parts in which the pixel electrode 13 is not formed, the row banks 14X are formed on the interlayer insulating layer 12. That is, in the parts in which the pixel electrode 13 is not formed, the bottom surfaces of the row banks 14X are in contact with the upper surface of the interlayer insulating layer 12.

The row banks 14X are to provide electric insulation between pixel electrodes 13 adjacent to each other in the Y-direction and control a flow of an applied ink in the column direction (Y-direction) when a positive hole injection layer 15, a positive hole transporting layer 16, and a light emitting layer 17 are formed by a coating method. The shape of the row banks 14X is a truncated quadrangular pyramidal shape or a shape similar thereto. The row banks 14X have a cross section in a forward tapered trapezoidal shape tapered upward or an upwardly projecting cup shape. In addition, the height of the row banks 14X from the interlayer insulating layer 12 is lower than the height of the column banks 14Y from the interlayer insulating layer 12. The row banks 14X include a resin material. A positive photosensitive material, for example, can be used as the resin material. Specifically, such photosensitive materials include an acrylic-based resin, a polyimide-based resin, a siloxane-based resin, a phenol-based resin, and the like. Incidentally, the resin material is not limited to the positive photosensitive material. A negative photosensitive material, for example, may be used as the resin material, or a non-photosensitive material may be used as the resin material.

<Opening Adjusting Layer 14I>

The opening adjusting layer 14I is an insulating layer for reducing the opening area of the pixel 100 defined by row banks 14X and column banks 14Y. The opening adjusting layer 14I is formed on the pixel electrode 13.

In the present embodiment, the opening adjusting layer 14I is formed on the pixel electrode 13R in the red light emitting element 100R so as to be continuous with the row bank 14X. Hence, in the red light emitting element 100R, the ratio of an effective area of the self-luminous region 100a is decreased with respect to the opening area of the pixel 100R defined by the row banks 14X and the column banks 14Y.

The opening adjusting layer 14I is to electrically insulate a part of the pixel electrode 13 from the light emitting layer 17 and limit the area of a positive hole transporting layer 16 after drying to the effective area of the self-luminous region 100a when the positive hole transporting layer 16 is formed by a coating method. The shape of the opening adjusting layer 14I is a truncated quadrangular pyramidal shape or a shape similar thereto. The upper surface of the opening adjusting layer 14I is substantially flat. In addition, the height of the opening adjusting layer 14I from the interlayer insulating layer 12 is equal to or more than the height of the upper surface of the positive hole transporting layer 16 after drying from the interlayer insulating layer 12. In addition, the height of the opening adjusting layer 14I from the interlayer insulating layer 12 is equal to the height of the row bank 14X from the interlayer insulating layer 12, or is lower than that of the row bank 14X. Incidentally, a region inclining in a direction of approaching the self-luminous region 100a may be present as at least a part of the upper surface of the opening adjusting layer 14I. For example, the upper surface of the opening adjusting layer 14IR may be parallel with the top surface of the pixel electrode 13, or a part or the whole of the upper surface of the opening adjusting layer 14IR may become lower toward the self-luminous region 100a.

The opening adjusting layer 14I includes a resin material. A positive photosensitive material, for example, can be used as the resin material. Specifically, such photosensitive materials include an acrylic-based resin, a polyimide-based resin, a siloxane-based resin, a phenol-based resin, and the like. Incidentally, the resin material is not limited to the positive photosensitive material. A negative photosensitive material, for example, may be used as the resin material, or a non-photosensitive material may be used as the resin material.

<Positive Hole Injection Layer>

A positive hole injection layer 15 is provided on the pixel electrode 13 for a purpose of facilitating injection of positive holes (holes) from the pixel electrode 13 to the light emitting layer 17. Concrete examples of a material for the positive hole injection layer 15 include, for example, PEDOT/PSS (mixture of polythiophene and polystyrene sulfonate) and other conductive polymer materials. In a case where the positive hole injection layer 15 includes a conductive polymer material, the positive hole injection layer 15 can be formed as a coating film by a wet process such as a coating method or the like.

Incidentally, the positive hole injection layer 15 may be formed by an oxide of a transition metal. Concrete examples of the transition metal include Ag (silver), Mo (molybdenum), Cr (chromium), V (vanadium), W (tungsten), Ni (nickel), Ir (iridium), and the like. The transition metal assumes a plurality of oxidation numbers, and can therefore assume a plurality of levels. As a result, the transition metal facilitates positive hole injection, and contributes to a reduction in driving voltage. In this case, the positive hole injection layer 15 preferably has a large work function. In a case where the positive hole injection layer 15 is formed by an oxide of a transition metal, the positive hole injection layer 15 can be formed by a vacuum evaporation method, sputtering, or the like.

Incidentally, the positive hole injection layer 15 may be of a laminated structure obtained by laminating a conductive polymer material onto an oxide of a transition metal. In this case, the positive hole injection layer 15 can be formed by forming the oxide of the transition metal by a vacuum evaporation method, sputtering, or the like, shaping the oxide of the transition metal by etching or the like, and thereafter film-forming the conductive polymer material by a coating method. A part formed by the conductive polymer material becomes a coating film.

<Positive Hole Transporting Layer>

A positive hole transporting layer 16 has a function of transporting the positive holes injected from the positive hole injection layer 15 to the light emitting layer 17. The positive hole transporting layer 16 is formed by an organic material having a high positive hole mobility in order to transport the positive holes from the positive hole injection layer 15 to the light emitting layer 17 efficiently. The formation of the positive hole transporting layer 16 is performed by applying and drying an organic material solution. A high molecular compound such as polyfluorene, a derivative thereof, polyarylamine, a derivative thereof, or the like can be used as the organic material forming the positive hole transporting layer 16.

As described above, design for each light emission color in the resonator structure of light emitting elements 100 is made mainly by adjusting the film thickness of the positive hole transporting layer 16 and the film thickness of the light emitting layer 17. Hence, the film thickness of the positive hole transporting layer 16 differs for each light emission color of the light emitting elements 100. Specifically, because an optical path length between the pixel electrode and the counter electrode and an optical path length between the pixel electrode and a light emission center become longer depending on the wavelength of the light emission color, the longer the wavelength of the light emission color, the larger the film thickness of the positive hole transporting layer 16, and the shorter the wavelength of the light emission color, the smaller the film thickness of the positive hole transporting layer 16. Hence, the film thickness of a positive hole transporting layer 16B of a blue light emitting element 100B is smallest, the film thickness of a positive hole transporting layer 16G of a green light emitting element 100G is larger than the film thickness of the positive hole transporting layer 16B, and the film thickness of a positive hole transporting layer 16R of a red light emitting element 100R is largest.

In addition, in the present embodiment, because the opening adjusting layer 14IR is provided to the red light emitting element 100R, the positive hole transporting layer 16R is formed only in the self-luminous region 100a excluding a region on the opening adjusting layer 14IR. Incidentally, while a film of the same component as the positive hole transporting layer 16R may be formed above the opening adjusting layer 14IR, no current flows through the film, and thus does not function as the positive hole transporting layer 16R. Similarly, while a film of the same component as the positive hole transporting layer 16 may be formed above the row bank 14X, no current flows through the film, and therefore does not function as the positive hole transporting layer 16.

<Light Emitting Layer>

The light emitting layer 17 is formed within the gap 14a. The light emitting layer 17 has a function of emitting light of respective colors of R, G, and B by recombination of positive holes and electrons. A publicly known material can be used as a material for the light emitting layer 17.

In a case where the light emitting elements 100 are organic EL elements, the following, for example, can be used as an organic light emitting material included in the light emitting layer 17: a fluorescent material such as an oxinoid compound, a perylene compound, a coumarin compound, an azacoumarin compound, an oxazole compound, an oxadiazole compound, a perinone compound, a pyrrolopyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group III metal, a metal complex of oxine, a rare earth metal complex, or the like. In addition, a publicly known phosphorescent material such as a metal complex emitting phosphorescence such as tris(2-phenylpyridine)iridium or the like can be used. In addition, the light emitting layer 17 may be formed by using a high molecular compound such as polyfluorene, a derivative thereof, polyphenylene, a derivative thereof, polyarylamine, a derivative thereof, or the like, or a mixture of the above low molecular compound and the above high molecular compound. Incidentally, the light emitting elements 100 may be quantum dot light emitting elements (QLED; Quantum-dot Light Emitting Diode), and a material having a quantum dot effect can be used as a material for the light emitting layer 17.

In addition, because the opening adjusting layer 14IR is disposed in the red light emitting element 100R in the present embodiment, a part present within the self-luminous region 100a excluding a region on the opening adjusting layer 14IR, that is, only a part formed on the positive hole transporting layer 16R functions as a red light emitting layer 17R. Incidentally, while a film of the same component as the red light emitting layer 17R may be formed above the opening adjusting layer 14IR, no current flows through the film, and therefore does not function as the red light emitting layer 17R. Similarly, while a film of the same component as the light emitting layer 17 may be formed above the row bank 14X, no current flows through the film, and therefore does not function as the light emitting layer 17.

<Electron Transporting Layer>

An electron transporting layer 18 is formed on the light emitting layer 17 and the column banks 14Y so as to be common to a plurality of pixels. The electron transporting layer 18 has a function of transporting electrons injected from a counter electrode 20 to the light emitting layer 17. The electron transporting layer 18 is, for example, formed by using an oxadiazole derivative (OXD), a triazole derivative (TAZ), a phenanthroline derivative (BCP, Bphen), or the like.

The formation of the electron transporting layer 18 is, for example, performed by film-forming a material such as an oxadiazole derivative, a triazole derivative, a phenanthroline derivative, or the like by an evaporation method so as to be common to the plurality of pixels. Incidentally, the electron transporting layer 18 may be formed by a coating method. In this case, the electron transporting layer 18 may be formed pixel by pixel as with the light emitting layer 17 and the like.

<Electron Injection Layer>

An electron injection layer 19 is provided on the electron transporting layer 18 so as to be common to the plurality of pixels. The electron injection layer 19 has a function of facilitating injection of electrons from the counter electrode 20 to the light emitting layer 17.

The electron injection layer 19 is, for example, formed by doping an organic material having an electron transporting property with a metallic material that improves an electron injection property. Here, doping refers to substantially uniformly dispersing metal atoms or metal ions of the metallic material into the organic material, and specifically refers to forming a single phase including the organic material and a minute amount of the metallic material. Incidentally, other phases, particularly a phase including only the metallic material such as a metallic piece, a metallic film, or the like or a phase including the metallic material as a main component, are preferably not present. In addition, in the single phase including the organic material and the minute amount of metallic material, the concentration of metal atoms or metal ions is preferably uniform, and the metal atoms or the metal ions preferably do not cohere. The metallic material is preferably selected from alkali metals, alkaline earth metals, and rare earths, and is more preferably Ba or Li. Ba is selected in the present embodiment. In addition, a doping amount of the metallic material in the electron injection layer 19 is preferably 5 wt % to 40 wt %. The doping amount of the metallic material in the electron injection layer 19 wt % is 20 wt % in the present embodiment. Organic materials having an electron transporting property include, for example, n electron low molecular organic materials such as an oxadiazole derivative (OXD), a triazole derivative (TAZ), a phenanthroline derivative (BCP, Bphen), and the like.

Incidentally, the electron injection layer 19 may have a metal fluoride layer selected from alkali metals or alkaline earth metals on the light emitting layer 17 side.

The formation of the electron injection layer 19 is, for example, performed by film-forming a material such as an oxadiazole derivative, a triazole derivative, a phenanthroline derivative, or the like and the metallic material by a co-evaporation method so as to be common to the plurality of pixels. Incidentally, the electron injection layer 19 may be formed by a coating method. In this case, the electron injection layer 19 may be formed pixel by pixel as with the light emitting layer 17 and the like.

<Counter Electrode>

The counter electrode 20 is formed on the electron injection layer 19 so as to be common to the plurality of pixels. The counter electrode 20 functions as a cathode.

In the present embodiment, the counter electrode 20 combines transparency and conductivity, and includes at least one of a metallic layer including a metallic material and a metallic oxide layer including a metallic oxide. In order to ensure transparency, the film thickness of the metallic layer is substantially 1 nm to 50 nm. Materials for the metallic layer include, for example, Ag, a silver alloy including Ag as a main component, Al, and an Al alloy including Al as a main component. A magnesium-silver alloy (MgAg) and an indium-silver alloy are cited as the Ag alloy. Ag basically has a low resistivity. The Ag alloy is excellent in heat resistance and corrosion resistance, and is preferable in that the Ag alloy can maintain excellent electrical conductivity over a long period of time. A magnesium-aluminum alloy (MgAl) and a lithium-aluminum alloy (LiAl) are cited as the Al alloy. Other alloys include a lithium-magnesium alloy and a lithium-indium alloy. Materials for the metallic oxide layer include, for example, ITO (indium tin oxide) and IZO (indium zinc oxide).

The cathode may be formed by a single metallic layer or a single metallic oxide layer. However, the cathode may also be of a laminated structure obtained by laminating a metallic oxide layer onto a metallic layer or a laminated structure obtained by laminating a metallic layer onto a metallic oxide layer.

Incidentally, in a case where the pixel electrode 13, the interlayer insulating layer 12 under the pixel electrode 13, and the substrate 11 have transparency, the counter electrode 20 may be an electrode having light reflectivity. In this case, Ag, Al, an Al alloy, Mo, APC, ARA, MoCr, MoW, or NiCr can be used as a material for the counter electrode 20.

<Sealing Layer>

A sealing layer 21 is provided on the counter electrode 20. The sealing layer 21 has a function of preventing impurities (water and oxygen) from entering the counter electrode 20, the electron injection layer 19, the electron transporting layer 18, the light emitting layer 17, and the like from an opposite side from the substrate 11, and thereby suppressing degradation in these layers due to the impurities. The sealing layer 21 is formed by using a transparent material such as silicon nitride (SiN), silicon oxynitride (SiON), or the like. In addition, a sealing resin layer including a resin material such as an acrylic resin, an epoxy resin, or the like may be provided on a layer formed by using a material such as silicon nitride (SiN), silicon oxynitride (SiON), or the like.

In the present embodiment, because the organic EL display panel 10 is of a top emission type, the sealing layer 21 may need to include an optically transparent material.

<Others>

In the non-display region 10q of the demarcated region 10a, organic EL elements 100 may be formed, only a part of elements constituting the organic EL elements 100 may be formed, or no organic EL elements 100 may be formed. The coating films of the light emitting layer 17, the positive hole transporting layer 16, and the like may be formed as a dummy pixel in each region of the non-display region 10q. By forming the coating films in the dummy pixel, it is possible to uniformize the vapor pressure of a solvent at a time of formation (at a time of drying) of the coating films, and suppress variations in the film thickness of the coating films in the display region 10p.

Incidentally, the opening adjusting layer 14I may be provided in the non-display region 10q. This facilitates formation because the pattern mask shape of the opening adjusting layers 14I and the column banks 14Y does not need to be changed between the display region 10p and the non-display region 10q. Similarly, pixel electrodes 13 may be provided in the non-display region 10q.

Incidentally, TFTs may be provided in the non-display region 10q, or may not be provided in the non-display region 10q.

2. Effects of Opening Adjusting Layer According to Embodiment

Figure 7A:
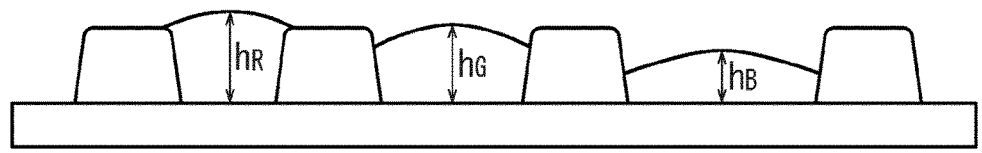
FIG. 7A is a schematic sectional view of positive hole transporting layers according to the embodiment immediately after application of a material ink.
Figure 7A:
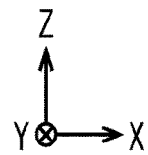
Figure 7B:
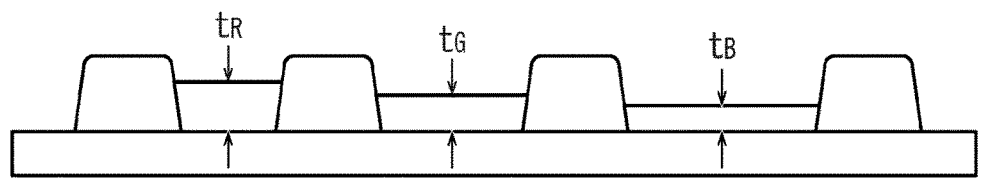
FIG. 7B is a schematic sectional view of positive hole transporting layers according to the embodiment and a comparative example.
Figure 7B:
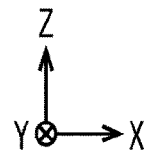
Figure 7C:
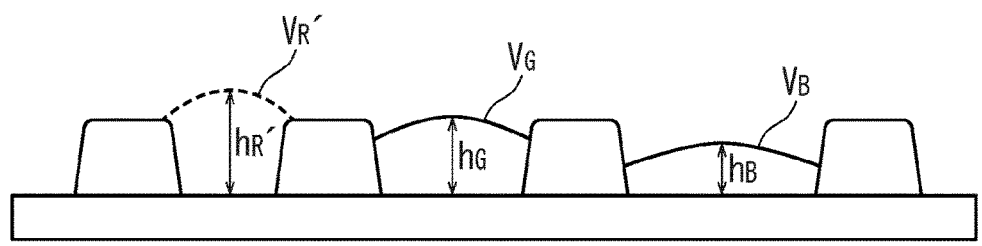
FIG. 7C is a schematic sectional view of the positive hole transporting layers according to the comparative example immediately after application of a material ink.
Figure 7C:
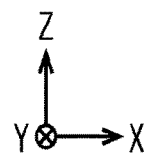
Figure 8A:
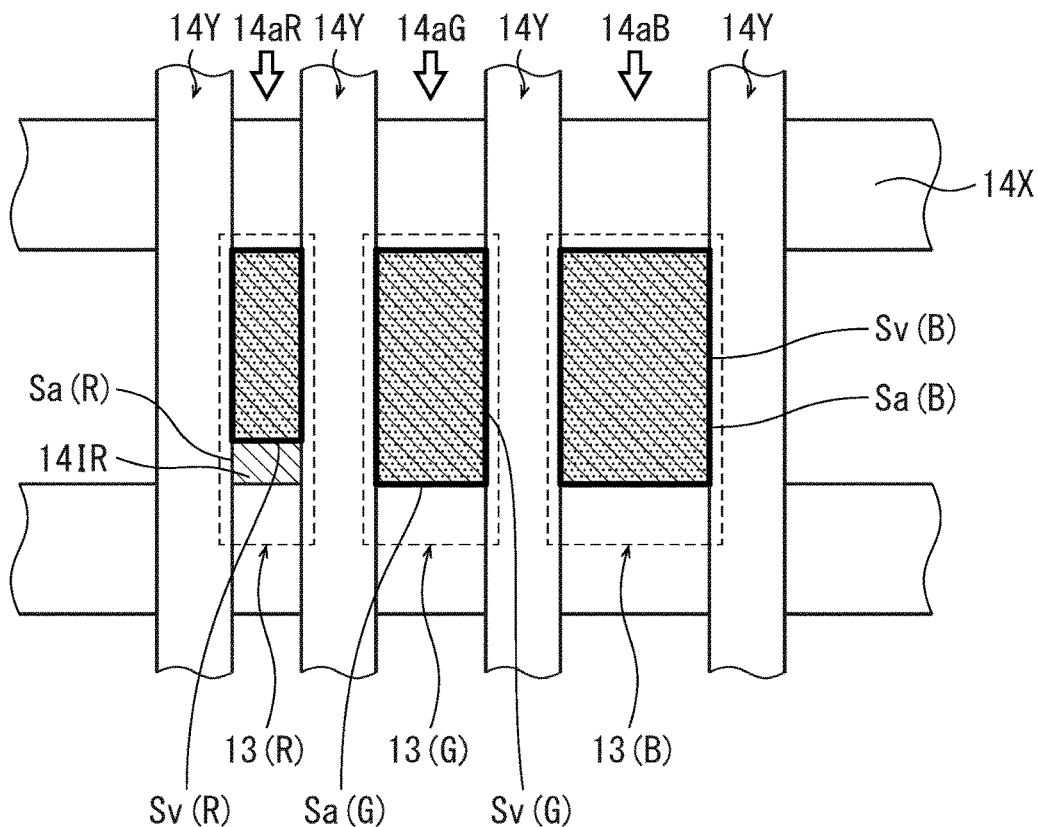
FIG. 8A is a plan schematic view depicting relation between an effective area in which a positive hole transporting layer is formed and an opening area as an ink application area.
Figure 8B:
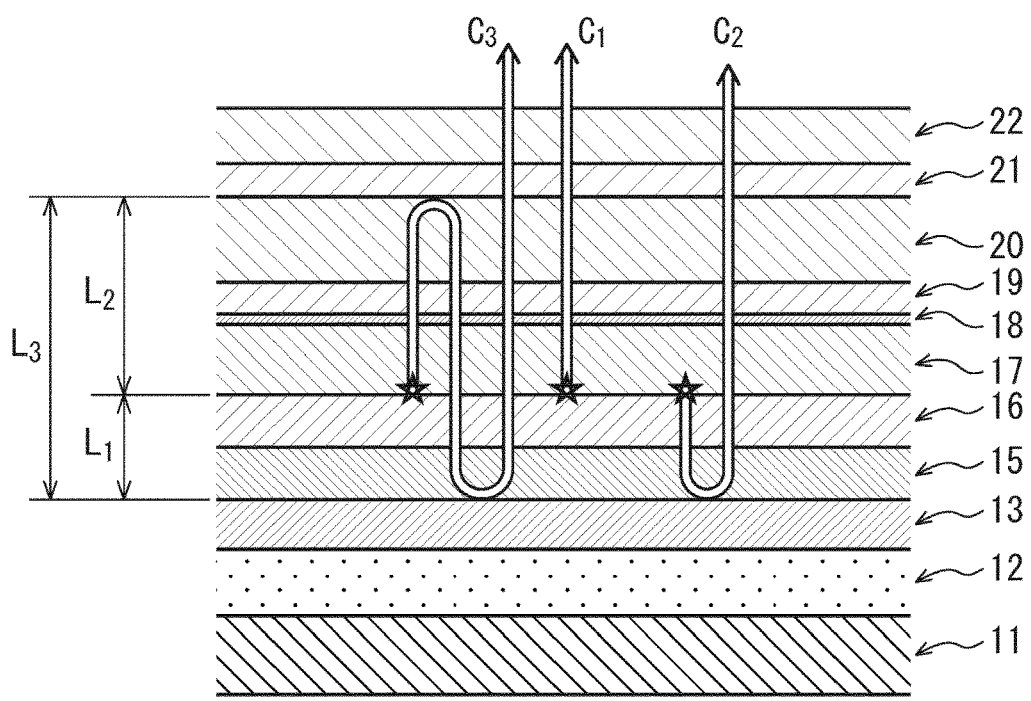
FIG. 8B is a schematic sectional view depicting an outline of an optical resonator.

Effects of the opening adjusting layer according to the embodiment will be described in the following with reference to schematic drawings. FIG. 8A is a schematic plan view depicting relation between an opening area and an effective area. FIGS. 7A and 7B are sectional schematic views depicting states of positive hole transporting layers 16 according to the embodiment immediately after coating and after drying. FIG. 7C is a sectional schematic view depicting a state of positive hole transporting layers 16 according to a comparative example immediately after coating.

FIG. 8A is a plan schematic view depicting relation between an opening area and an effective area of each light emitting element 100. Outer edges of the light emitting element 100 are defined by column banks 14Y and row banks 14X. Thus, an opening area Sa is defined by two column banks 14Y adjacent to each other in the row direction and two row banks 14X adjacent to each other in the column direction. A material for forming the positive hole transporting layer 16 is applied to the inside of the outer edges of the light emitting element 100 defined by the column banks 14Y and the row banks 14X. Therefore, letting h be the height of the column banks 14Y with respect to the upper surface of the positive hole injection layer 15, an amount of ink not exceeding h×Sa can be applied to one light emitting element.

On the other hand, a region in which the positive hole transporting layer 16 electrically connected to the pixel electrode 13 is formed differs for each light emission color. In the green light emitting element 100G and the blue light emitting element 100B not having the opening adjusting layer 14I, the positive hole transporting layers 16 after drying are formed on the inside of the outer edges of the light emitting elements 100 defined by the column banks 14Y and the row banks 14X. That is, effective areas Sv as the areas of the positive hole transporting layers 16 after drying coincide with the opening area Sa. On the other hand, in the red light emitting element 100R having the opening adjusting layer 14I, the positive hole transporting layer 16 after drying is not formed on the opening adjusting layer 14I.

Hence, an effective area Sv(R) as the area of the positive hole transporting layer 16R after drying is smaller than an opening area Sa(R) by the area of the opening adjusting layer 14I.

Here, as depicted in FIG. 7B, a case is assumed in which design is made such that $T_R > T_G > T_B$, where $T_R$, $T_G$, and $T_B$ are the respective film thicknesses of the positive hole transporting layer 16R of the red light emitting element 100R, the positive hole transporting layer 16G of the green light emitting element 100G, and the positive hole transporting layer 16B of the blue light emitting element 100B. In the comparative example in which the opening adjusting layer 14I is not provided, the effective area Sv(R) as the area of the positive hole transporting layer 16R after drying coincides with the opening area Sa(R). Hence, the volumes of the positive hole transporting layers 16 after drying are expressed by products $Sa(R) \times T_R$, $Sa(G) \times T_G$, and $Sa(B) \times T_B$ of the film thicknesses T of the positive hole transporting layers 16 after drying and the effective areas Sv. On the other hand, letting $h_R'$, $h_G$, and $h_B$ be necessary ink heights for forming the positive hole transporting layer 16R of the red light emitting element 100R, the positive hole transporting layer 16G of the green light emitting element 100G, and the positive hole transporting layer 16B of the blue light emitting element 100B, respectively, ink volumes are expressed by $Sa(R) \times h_R'$, $Sa(G) \times h_G$, and $Sa(B) \times h_B$, respectively. Here, when the positive hole transporting layers 16R, 16G, and 16B are formed by using a same ink, the volumes of the ink and the volumes of the positive hole transporting layers 16 are in proportional relation, and therefore a relation $h_R':h_G:h_B = T_R:T_G:T_B$ holds. Hence, when a ratio $T_R/T_B$ is high, problems may occur in that, for example, when control is performed so as not to make the amount of ink of the positive hole transporting layer 16B too small, $h_R'$ becomes excessive and an ink overflow occurs, when control is performed so as to prevent the ink of the positive hole transporting layer 16R from overflowing, $h_B$ becomes too small, and the ink does not sufficiently become wet and spread, and discharge may not be performed with a same ink jet head as that of the ink of the positive hole transporting layer 16R.

On the other hand, in the embodiment in which the opening adjusting layer 14I is provided, the effective area Sv(R) is smaller than the opening area Sa(R), as described above. Hence, while the volume of the positive hole transporting layer 16R after drying is expressed by $Sv(R) \times T_R$, the volume of the ink is expressed by $Sa(R) \times h_R$, where a necessary ink height for forming the positive hole transporting layer 16R of the red light emitting element 100R is $h_R$. Hence, when the positive hole transporting layers 16R, 16G, and 16B are formed by using a same ink, a relation $h_R:h_G:h_B = T_R \times \{Sv(R)/Sa(R)\}:T_G:T_B$ holds. Hence, it suffices for $h_R$ to be $h_B \times \{T_R/T_B\} \times \{Sv(R)/Sa(R)\}$, and $h_R$ is smaller than $h_R' = h_B \times \{T_R/T_B\}$. Hence, even when the ratio $T_R/T_B$ is high, a ratio $h_R/h_B$ can be reduced, and even when the film thicknesses of the positive hole transporting layers 16R, 16G, and 16B differ from one another greatly, the positive hole transporting layers 16R, 16G, and 16B can be formed by a same coating device using the same ink.

Incidentally, in order for the opening adjusting layer 14IR to exert the above-described effects, it is necessary for the positive hole transporting layer 16R after drying not to be substantially formed above the opening adjusting layer 14IR. Hence, in order for the positive hole transporting layer 16R after drying not to be formed above the opening adjusting layer 14IR, the height of the upper surface of the opening adjusting layer 14IR is preferably equal to or more than the height of the positive hole transporting layer 16R after drying. Incidentally, it is more desirable that a region inclining in a direction of approaching the self-luminous region 100a be present as at least a part of the upper surface of the opening adjusting layer 14IR because the ink being dried flows into the self-luminous region 100a easily, and it is preferable that the height of the whole of the upper surface of the opening adjusting layer 14IR be equal to or more than the height of the positive hole transporting layer 16R after drying. Incidentally, a state in which the positive hole transporting layer 16R after drying is not substantially formed above the opening adjusting layer 14IR refers to a state in which a layer having substantially the same film thickness and including the same component is not formed above the positive hole transporting layer 16R after drying, and does not refers to a state in which a layer including the same component as the positive hole transporting layer 16R after drying is not present above the opening adjusting layer 14IR. Incidentally, as described above, the opening adjusting layer 14IR is an insulating layer. Thus, even when there is a layer above the opening adjusting layer 14IR, no current flows through the layer, and therefore the layer does not function as a part of the light emitting element.

Incidentally, it is assumed here that the film thicknesses of the positive hole transporting layers 16R, 16G, and 16B film-formed by the same ink in the red light emitting element 100R, the green light emitting element 100G, and the blue light emitting element 100B differ from one another. However, without limitation to the positive hole transporting layers, a similar configuration can provide similar effects also on other functional layers such as the positive hole injection layers, electron blocking layers, and the like as long as the other functional layers are functional layers different in film thickness between a plurality of elements and film-formed by the same ink. In this case, the height of the upper surface of the opening adjusting layer 14I may need to be at least higher than the upper surface of the functional layer after drying. In addition, while different inks are used for respective light emission colors in forming the light emitting layers, similar effects can be obtained by a similar configuration, for example, in a case where the concentration of an ink used for a light emitting layer of a specific color is low with respect to a light emitting layer of another color and there is a fear of an ink overflow due to constraints such as solubility of a solute in a solvent, a drying condition, ink viscosity, and the like. In this case, the height of the upper surface of the opening adjusting layer 14I may need to be at least higher than the upper surface of the light emitting layer after drying.

SUMMARY

As described above, the opening adjusting layer according to the embodiment is suitable as a design for preventing an ink from overflowing in a case where the film thickness of a functional layer formed by a coating method differs between light emitting elements adjacent to each other in the row direction. Hence, for example, the film thickness of the functional layer can be changed easily while a same ink is used, and an improvement in characteristics of light emitting elements can be achieved by a simple manufacturing process. Alternatively, for example, the opening adjusting layer according to the embodiment is suitable as a design for preventing the ink from overflowing in a case where an amount of ink for forming the functional layer by a coating method differs greatly between the light emitting elements adjacent to each other in the row direction. Hence, for example, an improvement in characteristics of the light emitting elements can be achieved by a simple manufacturing process without the height of the row banks being changed.

Incidentally, according to the opening adjusting layer in accordance with the embodiment, the aperture ratio of the light emitting element whose functional layer has a large film thickness and which is provided with the opening adjusting layer is lowered because the ratio of the self-luminous region 100a is decreased and the ratio of the non-self-luminous region 100b is increased in the light emitting element. However, when a light resonator structure is used as described above, the film thickness of the positive hole transporting layer in the light emitting element whose light emission color has a long wavelength, for example, the red light emitting element is large, and the film thickness of the positive hole transporting layer in the light emitting element whose light emission color has a short wavelength, for example, the blue light emitting element is small. Further, in general, the longer the wavelength of the light emission color, the higher the light emission efficiency of the light emitting layer. Hence, in the red light emitting element, the resonator structure improves light extraction efficiency in addition to high efficiency of the light emitting layer. Thus, even when the opening adjusting layer decreases the aperture ratio, the efficiency of the red light emitting element is sufficiently high as compared with the efficiency of the blue light emitting element, and adverse effects on the light emission efficiency and life of the whole of the display panel can be ignored.

3. Method of Manufacturing Organic EL Display Panel 10

A method of manufacturing the organic EL display panel 10 will next be described with reference to drawings.

Figure 9:
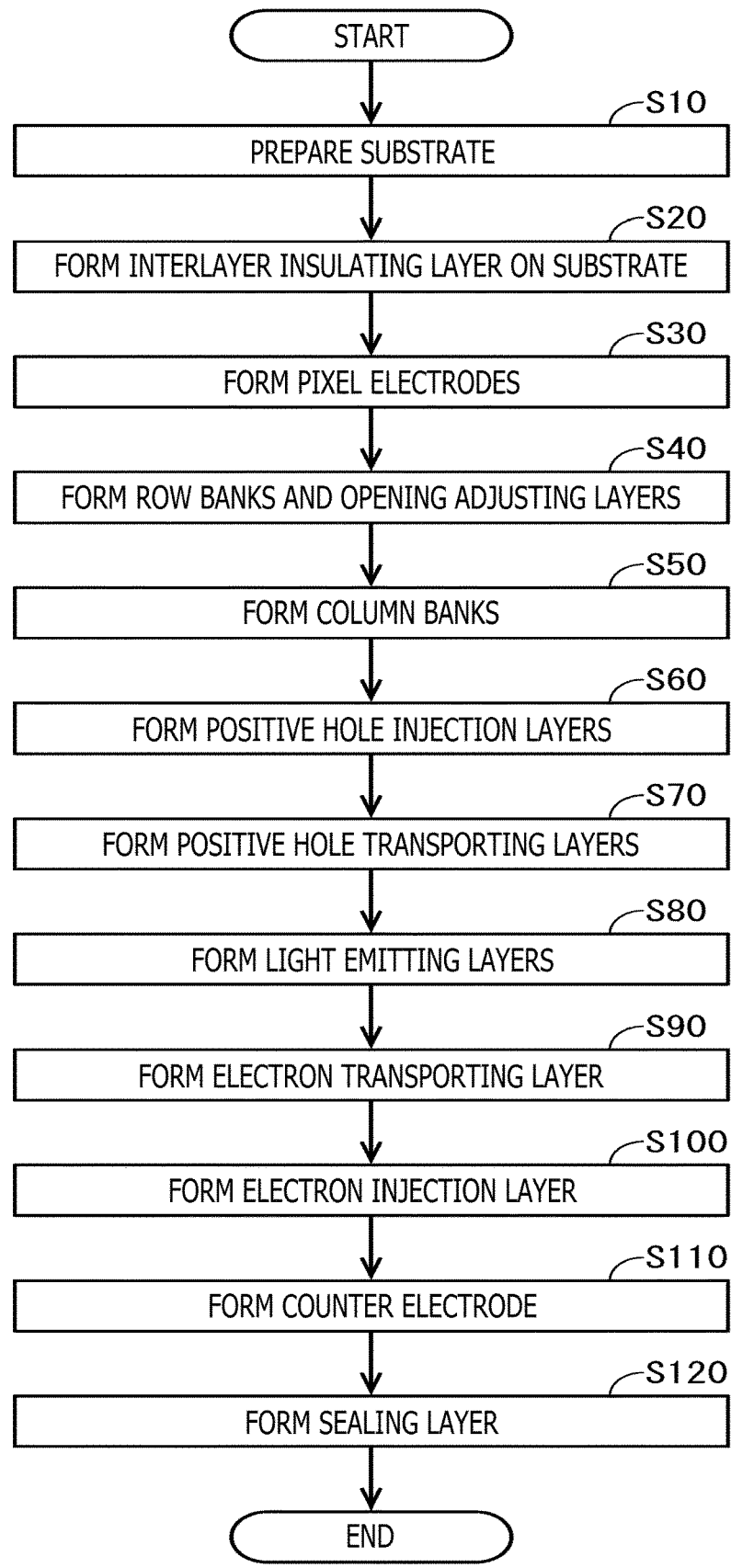
FIG. 9 is a flowchart depicting processes of manufacturing the display panel according to the embodiment.

FIG. 9 is a flowchart depicting a method of manufacturing the organic EL display panel 10. FIGS. 10 to 13 are schematic sectional views depicting states in respective processes in the manufacturing of the organic EL display panel 10, and correspond to the section A2-A2 in FIG. 4. FIGS. 14A to 14C and FIGS. 15A and 15B are schematic sectional views depicting states in respective processes in the manufacturing of the organic EL display panel 10, and correspond to the section AR-AR in FIG. 4. FIGS. 14D to 14E and FIGS. 15C and 15D are schematic sectional views depicting states in respective processes in the manufacturing of the organic EL display panel 10, and correspond to the section AG-AG in FIG. 4.

(1) Fabrication of Substrate 11

First, a base material 111 is prepared (step S10). A substrate 11 (TFT substrate) is fabricated by film-forming a TFT layer 112 on the base material 111 (step S11, FIG. 10A). The TFT layer 112 can be film-formed by a publicly known TFT manufacturing method.

An interlayer insulating layer 12 is next formed on the substrate 11 (step S20). The interlayer insulating layer 12 is, for example, formed by uniformly applying a solution obtained by dissolving an acrylic-based resin, a polyimide-based resin, a siloxane-based resin, or a phenol-based resin as a positive photosensitive material in a solvent by using a spin coating method or the like, and exposing and developing the solution (FIG. 10B).

Figure 10A:
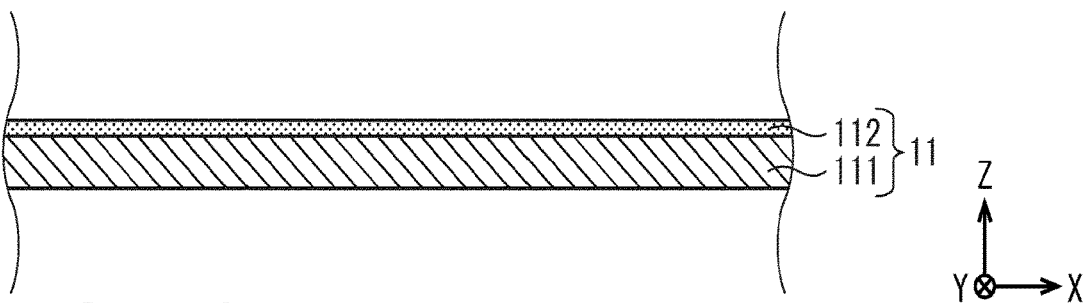
FIGS. 10A, 10B, 10C, and 10D are fragmentary sectional views schematically depicting a part of the processes of manufacturing the display panel according to the embodiment, FIG. 10A being a fragmentary sectional view depicting a state in which a thin film transistor (TFT) layer is formed on a base material, FIG. 10B being a fragmentary sectional view depicting a state in which an interlayer insulating layer is formed on the TFT layer, FIG. 10C being a fragmentary sectional view depicting a state in which a pixel electrode material layer is formed on the interlayer insulating layer, and FIG. 10D being a fragmentary sectional view depicting a state in which pixel electrodes are formed by patterning the pixel electrode material layer.
Figure 10B:
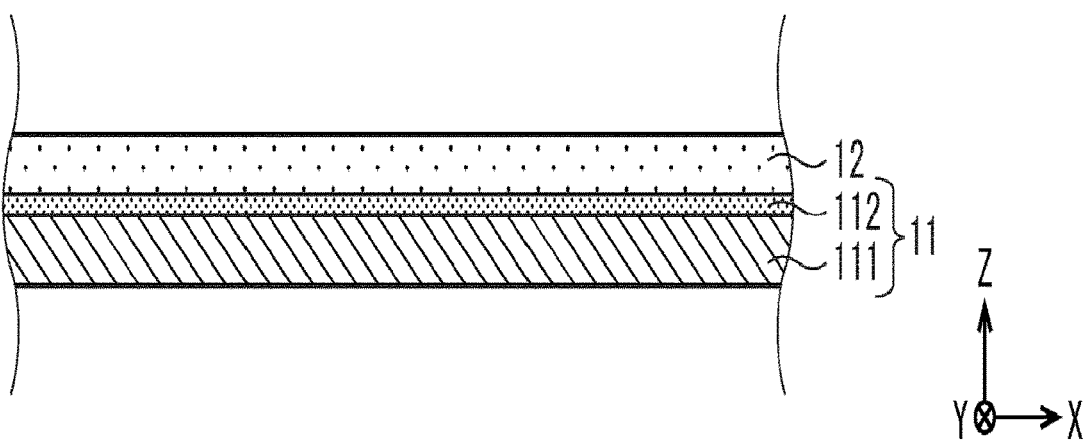

Incidentally, though not depicted in FIG. 10B, a contact hole is opened at a time of the exposure, and a connecting electrode is thereafter formed within the contact hole.

(3) Formation of Pixel Electrodes 13

Figure 10C:
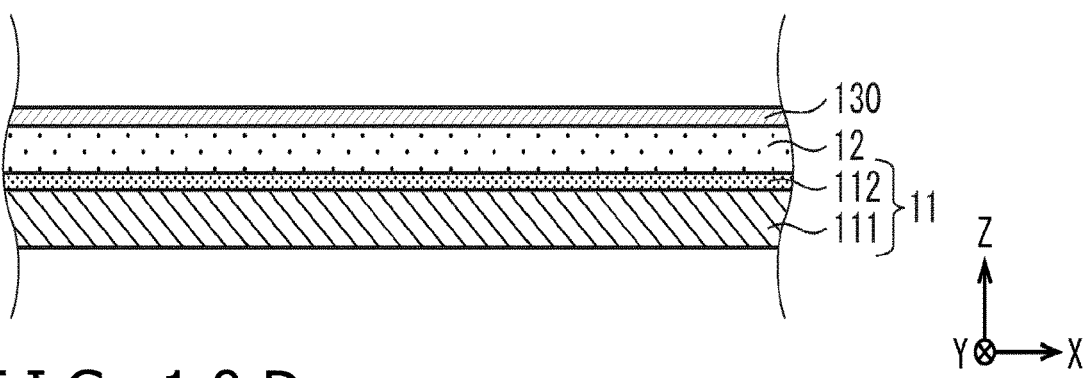

A pixel electrode material layer 130 is next formed on the interlayer insulating layer 12, as depicted in FIG. 10C. The pixel electrode material layer 130 can be formed by using, for example, a vacuum evaporation method, a sputtering method, or the like.

Figure 10D:
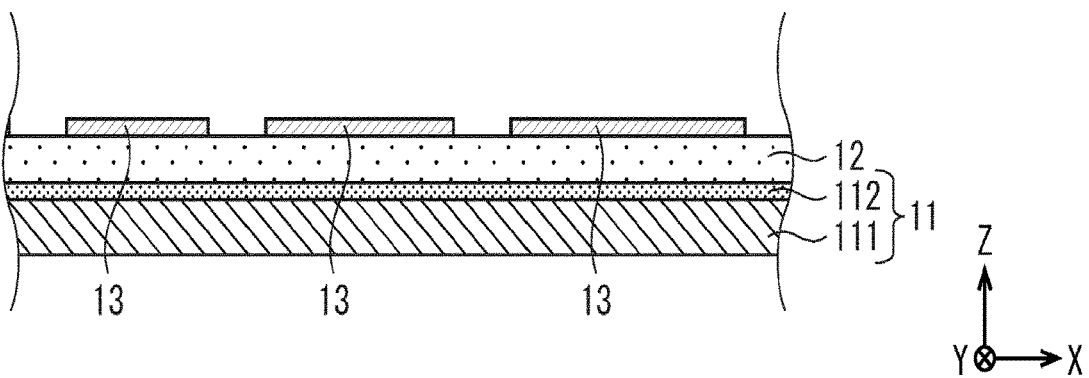

Then, as depicted in FIG. 10D, a plurality of pixel electrodes 13 divided for respective subpixels are formed by patterning the pixel electrode material layer 130 by etching (step S30).

(4) Formation of Row Banks 14X and Opening Adjusting Layers 14I

Figure 14A:
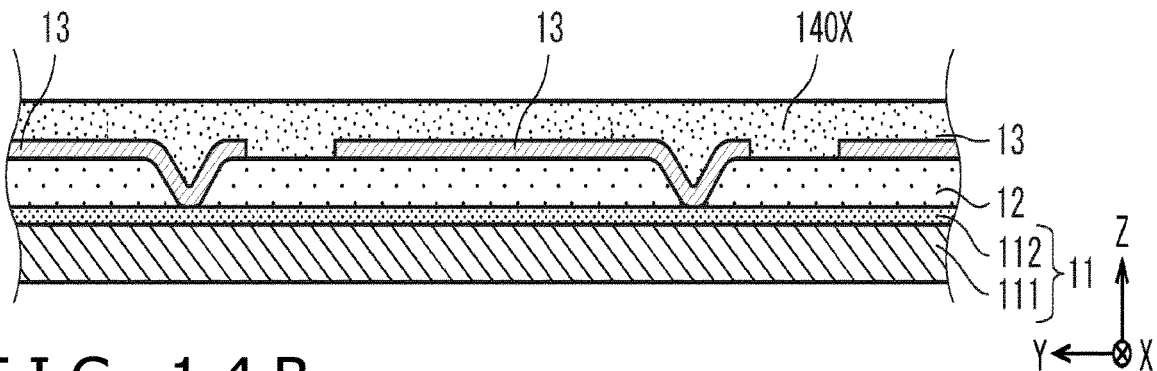
FIGS. 14A, 14B, 14C, 14D, and 14E are fragmentary sectional views schematically depicting a part of the processes of manufacturing the display panel according to the embodiment, FIG. 14A being a fragmentary sectional view depicting a state in which a row bank material layer is formed on the pixel electrodes and the interlayer insulating layer, FIG. 14B being a fragmentary sectional view depicting a state in which exposure using a photomask is performed on the row bank material layer, FIG. 14C being a fragmentary sectional view depicting a state in which row banks and opening adjusting layers are formed, FIG. 14D being a fragmentary sectional view depicting a state in which exposure using a photomask is performed on the row bank material layer, and FIG. 14E being a fragmentary sectional view depicting a state in which the row banks are formed.

Next, a row bank material layer 140X is formed by applying a row bank resin as a material for row banks 14X and opening adjusting layers 14I onto the pixel electrodes 13 and the interlayer insulating layer 12 (FIG. 14A). A phenol-based resin, an acrylic-based resin, a polyimide-based resin, or a siloxane-based resin as a positive photosensitive material, for example, is used as the row bank resin. The row bank material layer 140X is, for example, formed by uniformly applying a solution obtained by dissolving a sub-wall resin such as a phenolic resin or the like in a solvent onto the pixel electrodes 13 and onto the interlayer insulating layer 12 by using a spin coating method or the like.

Figure 14B:
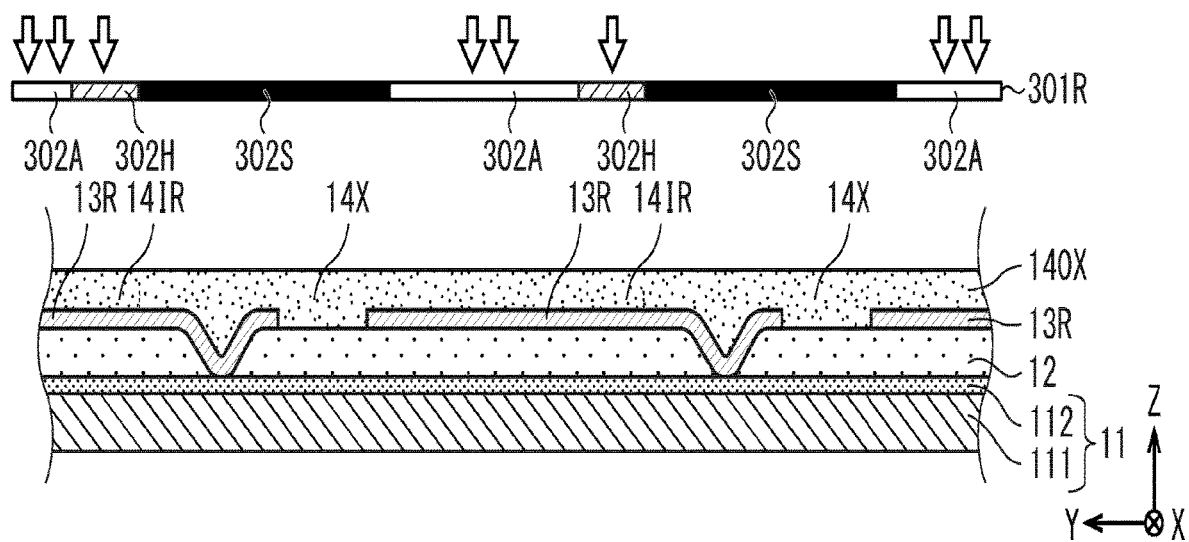
Figure 14C:
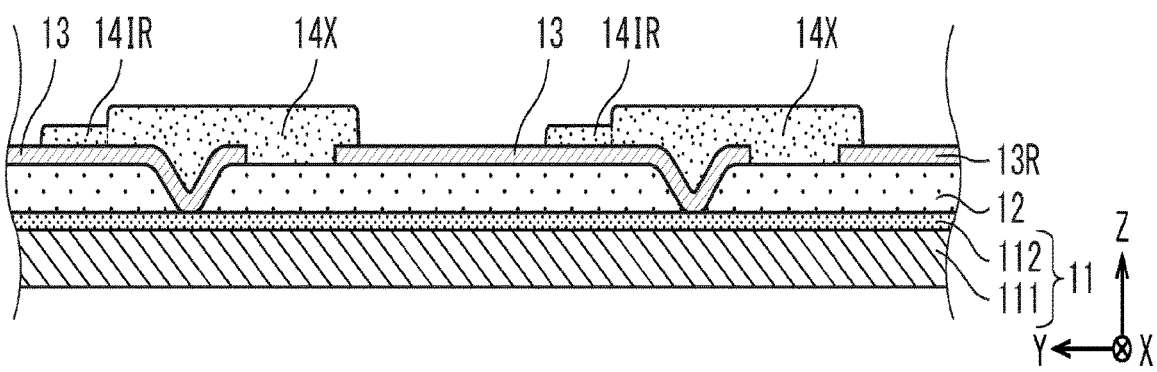
Figure 14D:
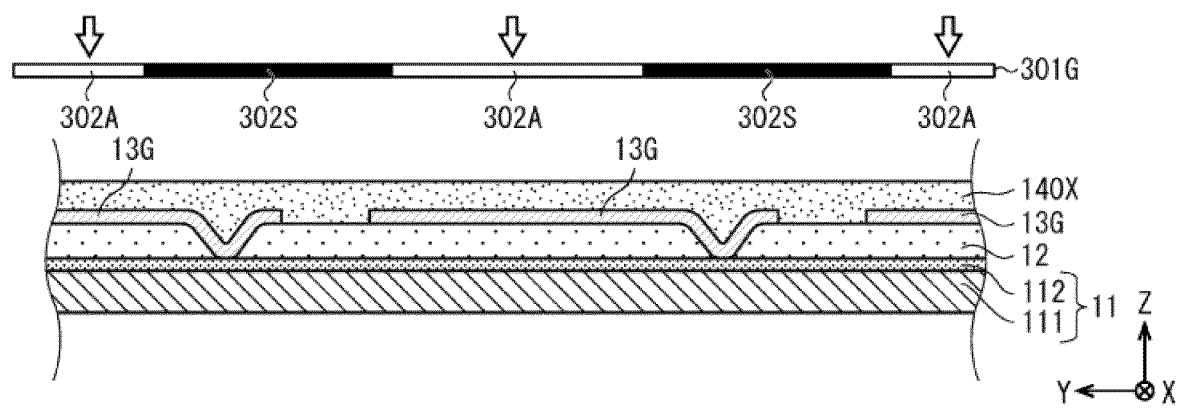
Figure 14E:
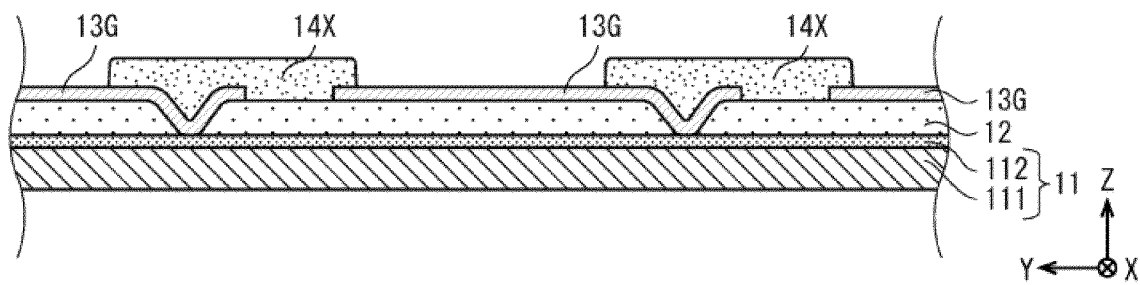

Next, the row banks 14X and the opening adjusting layers 14I are pattern-exposed by using a photomask (FIG. 14B and FIG. 14D). At this time, in a part 301R of the photomask which part is above the opening 14aR, parts corresponding to row banks 14X are light shielding parts 302S, parts corresponding to opening adjusting layers 14IR are half tone parts 302H, and other regions are light transmitting parts 302A. On the other hand, in a part 301G of the photomask which part is above the opening 14aG, there are no half tone parts 302H corresponding to the opening adjusting layers 14I, but parts corresponding to the row banks 14X are light shielding parts 302S, and other regions are light transmitting parts 302A. Incidentally, though not depicted here, a part 301 of the photomask which parts is above the opening 14aB has the same structure as the part 301G of the photomask which part is above the opening 14aG.

Next, exposed parts are removed by development, and firing is performed. Consequently, as depicted in FIG. 14C, the row banks 14X and the opening adjusting layers 14IR whose height is equal to or less than the height of the row banks 14X are formed in the opening 14aR. On the other hand, as depicted in FIG. 14D, only the row banks 14X are formed in the opening 14aG and the opening 14aB.

Incidentally, at least a part of the half tone parts 302H corresponding to the opening adjusting layers 14I may be provided with gradation such that light transmittance is increased toward the light transmitting parts 302A and the light transmittance is decreased toward the light shielding parts 302S. The present configuration causes at least a part of the upper surfaces of the opening adjusting layers 14IR to incline in a direction of approaching the self-luminous regions 100a. Thus, ink for forming functional layers flows into the self-luminous regions 100a easily.

In addition, in this case, a row bank 14X and an opening adjusting layer 14I are formed at a time using the same material. However, each of the row bank 14X and the opening adjusting layer 14I may be formed by individual film formation processing.

(5) Formation of Column Banks 14Y

Figure 11A:
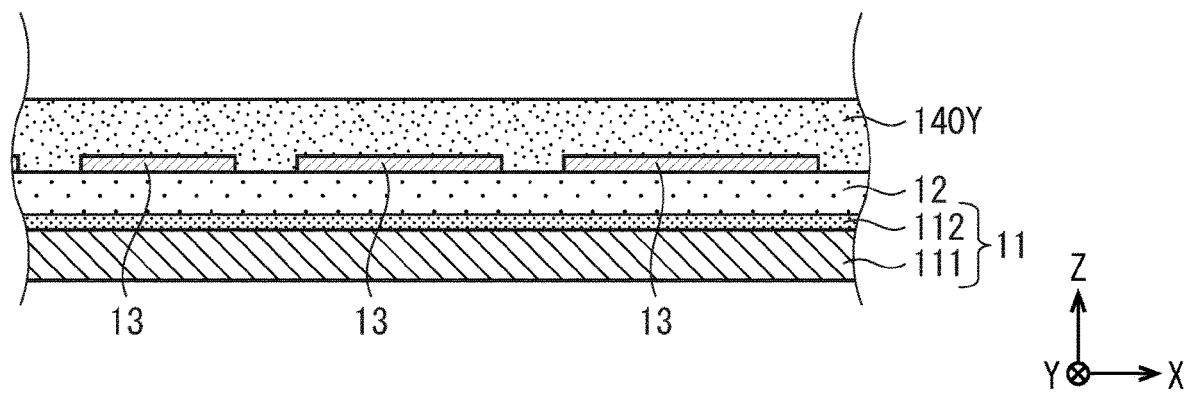
FIGS. 11A, 11B, 11C, and 11D are fragmentary sectional views schematically depicting a part of the processes of manufacturing the display panel according to the embodiment, FIG. 11A being a fragmentary sectional view depicting a state in which a column bank material layer is formed on the pixel electrodes and the interlayer insulating layer, FIG. 11B being a fragmentary sectional view depicting a state in which column banks are formed, FIG. 11C being a fragmentary sectional view depicting a state in which a material ink for positive hole injection layers are applied into opening portions of the column banks, and FIG. 11D being a fragmentary sectional view depicting a state in which positive hole injection layers are formed within the opening portions of the walls.

Next, as depicted in FIG. 11A, a column bank material layer 140 is formed by applying a column bank resin as a material for column banks 14Y onto the pixel electrodes 13, the interlayer insulating layer 12, the row banks 14X, and the opening adjusting layers 14I (step S50). Used as the column bank resin is, for example, one formed by adding a fluorine compound as a surface-active agent having a liquid repelling property to an acrylic-based resin, a polyimide-based resin, a siloxane-based resin, or a phenol-based resin as a positive photosensitive material.

Figure 11B:
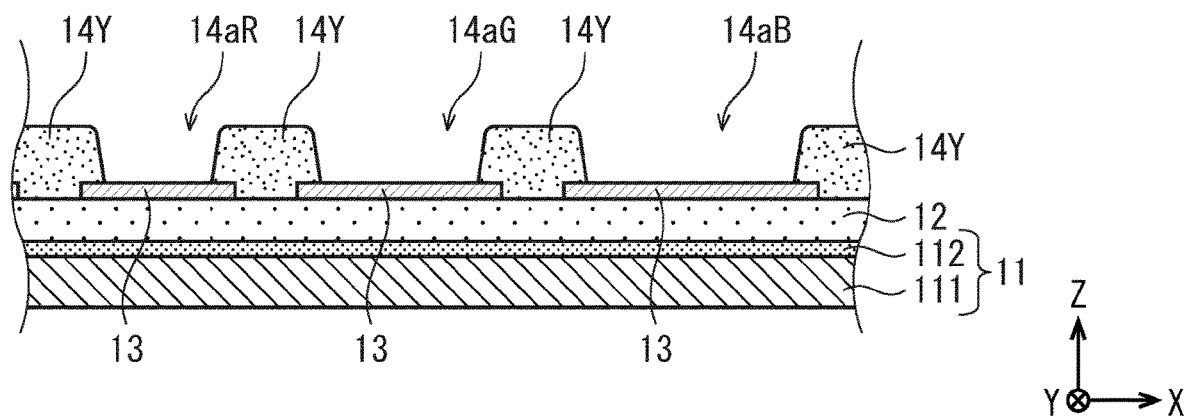

Next, the column bank material layer 140 is pattern-exposed by using a photomask. Next, as depicted in FIG. 11B, column banks 14Y are formed by removing exposed parts by development and performing firing.

(6) Film Formation of Positive Hole Injection Layers

Figure 11C:
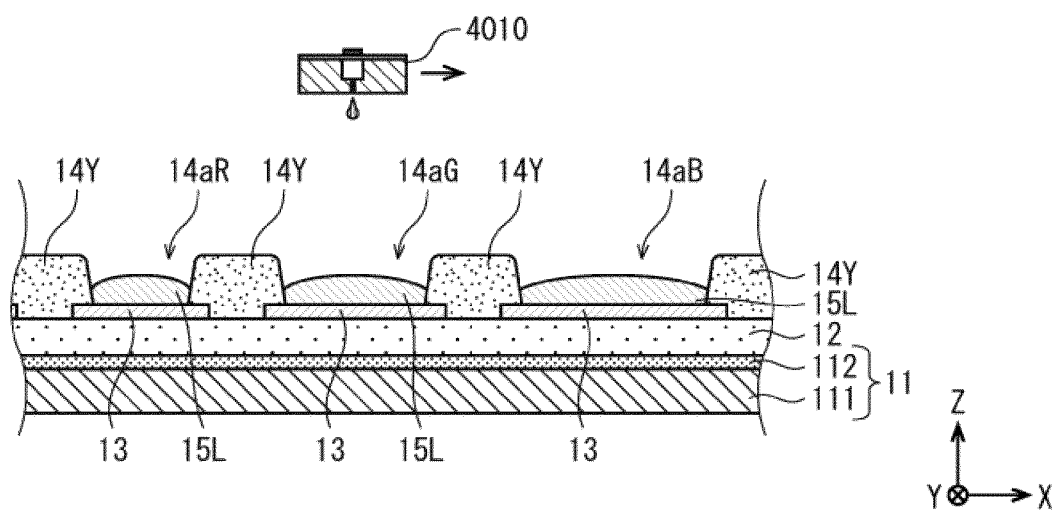
Figure 11D:
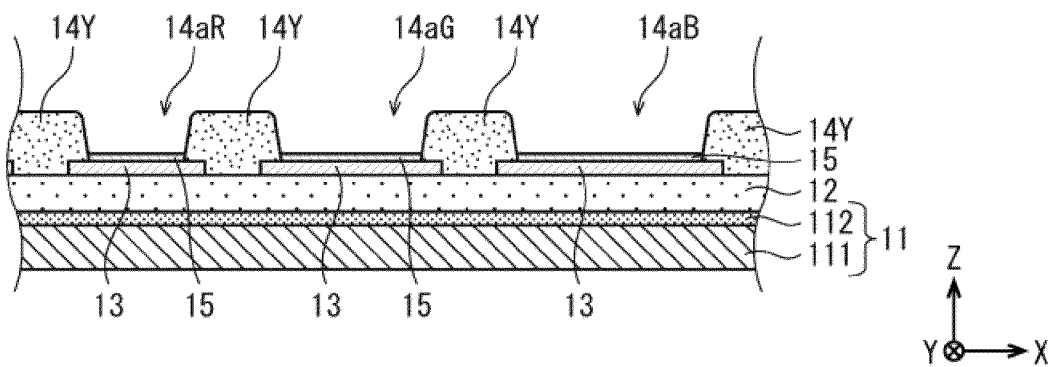

Next, as depicted in FIG. 11C, an ink including a constituent material for positive hole injection layers 15 is discharged from a nozzle 4010 of a coating device into each of the gaps 14aR, 14aG, and 14aB defined by the column banks 14Y, and is thus applied onto the pixel electrodes 13 within the gaps 14aR, 14aG, and 14aB. Then, as depicted in FIG. 11D, the positive hole injection layers 15 are formed by performing firing (drying) (step S60).

(7) Film Formation of Positive Hole Transporting Layers

Figure 12A:
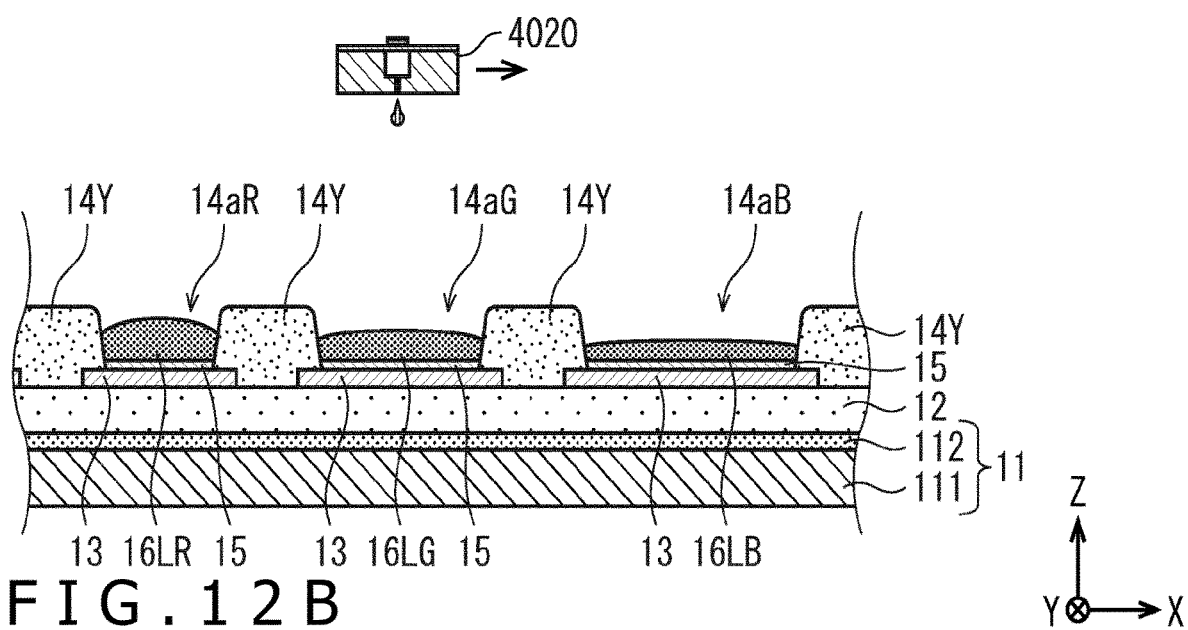
FIGS. 12A, 12B, 12C, and 12D are fragmentary sectional views schematically depicting a part of the processes of manufacturing the display panel according to the embodiment, FIG. 12A being a fragmentary sectional view depicting a state in which a material ink for positive hole transporting layers is applied into the opening portions of the column banks, FIG. 12B being a fragmentary sectional view depicting a state in which positive hole transporting layers are formed within the opening portions of the walls, FIG. 12C being a fragmentary sectional view depicting a state in which material inks for light emitting layers are applied into the opening portions of the column banks, and FIG. 12D being a fragmentary sectional view depicting a state in which light emitting layers are formed within the opening portions of the column banks.
Figure 12B:
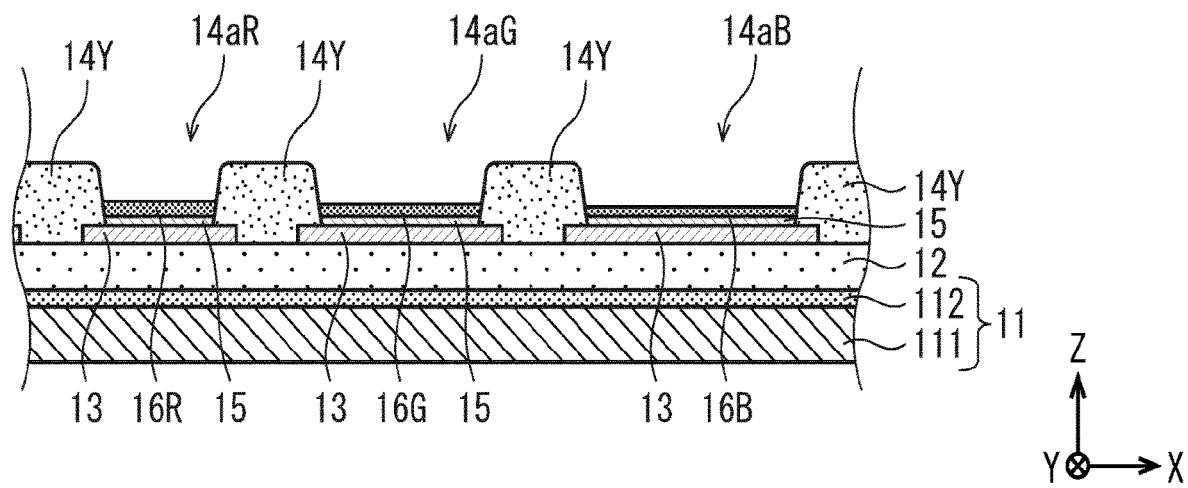
Figure 15A:
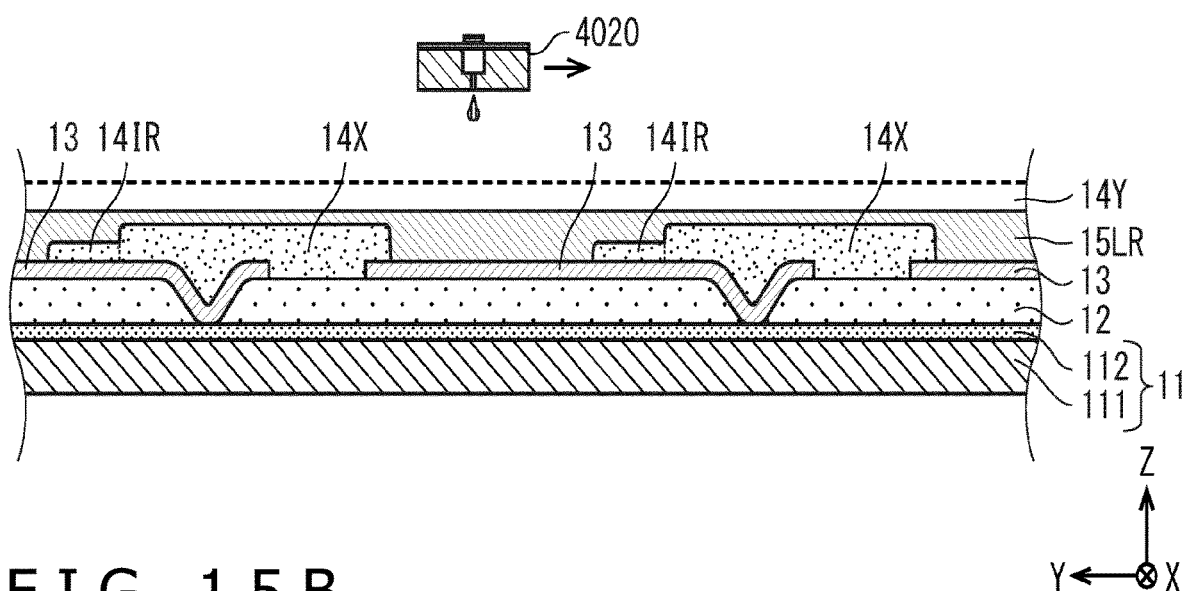
FIGS. 15A, 15B, 15C, and 15D are fragmentary sectional views schematically depicting a part of the processes of manufacturing the display panel according to the embodiment, FIG. 15A being a fragmentary sectional view depicting a state in which a material ink for positive hole transporting layers is applied into the opening portions of the row banks, FIG. 15B being a fragmentary sectional view depicting a state in which positive hole transporting layers are formed within the opening portions of the walls, FIG. 15C being a fragmentary sectional view depicting a state in which the material ink for positive hole transporting layers is applied into the opening portions of the row banks, and FIG. 15D being a fragmentary sectional view depicting a state in which positive hole transporting layers are formed within the opening portions of the walls.
Figure 15B:
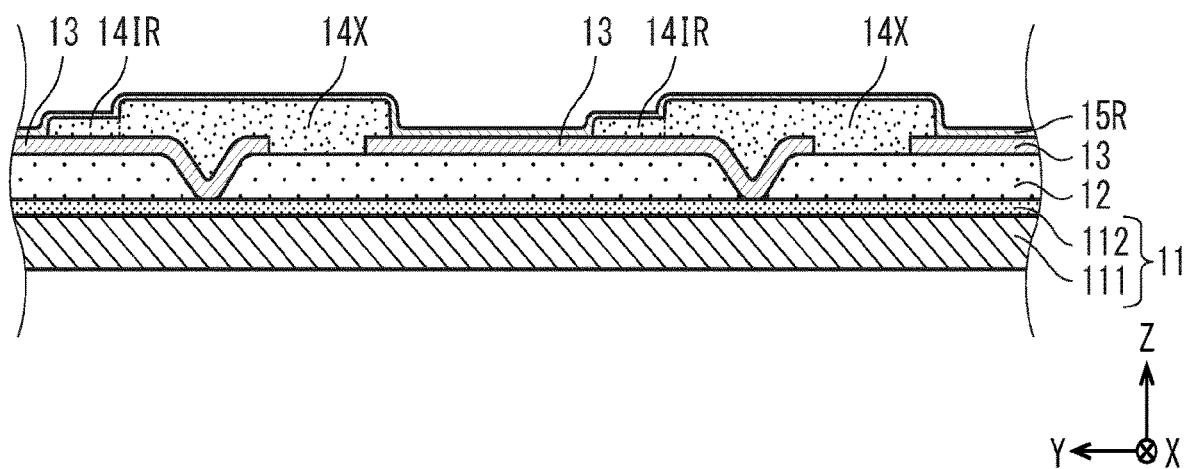
Figure 15C:
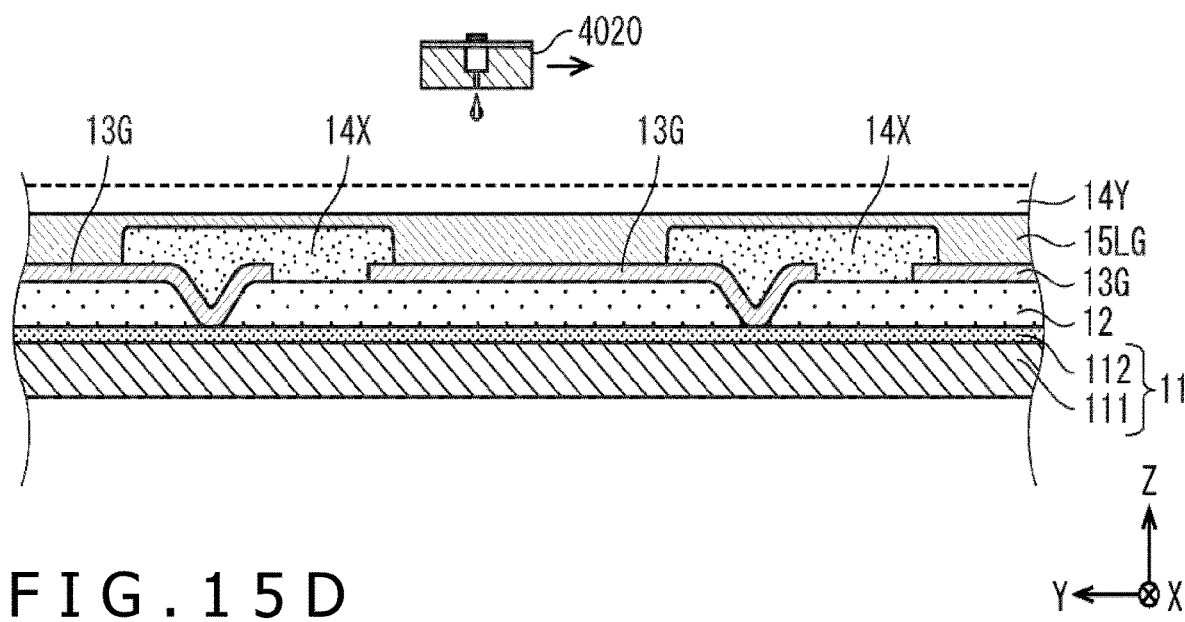
Figure 15D:
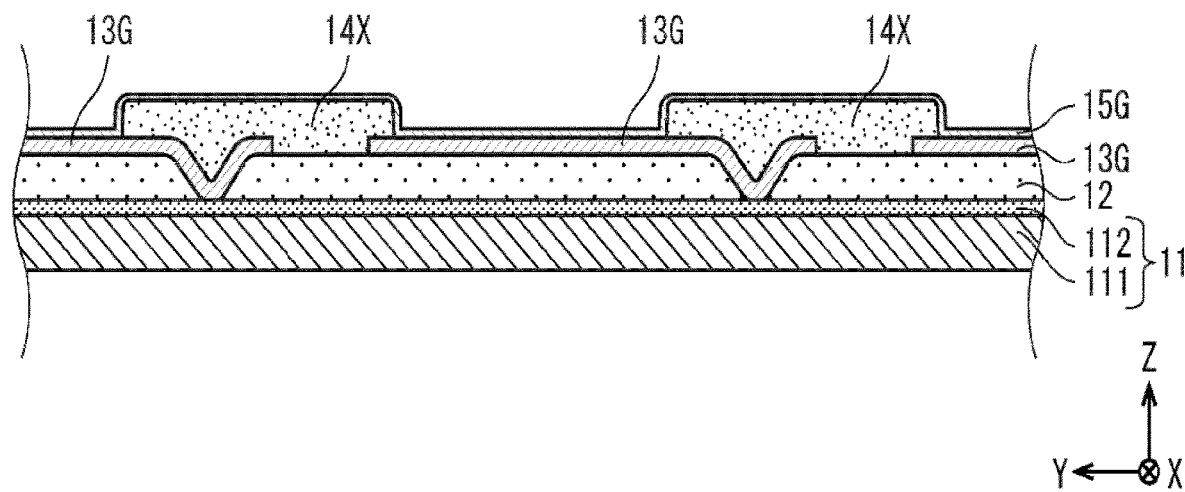

Next, as depicted in FIG. 12A and FIGS. 15A and 15C, an ink including a constituent material for positive hole transporting layers 16 is discharged from a nozzle 4020 of the coating device into each of the gaps 14aR, 14aG, and 14aB defined by the column banks 14Y, and is thus applied onto the positive hole injection layers 15 within the gaps 14aR, 14aG, and 14aB. In particular, as depicted in FIGS. 15A and 15C, the applied ink is present above the row banks 14X, and as depicted in FIG. 15A, the applied ink is present also above the opening adjusting layers 14IR. Then, as depicted in FIG. 12B and FIGS. 15B and 15D, positive hole transporting layers 16 are formed by performing firing (drying) (step S70). In particular, as depicted in FIG. 15D, the positive hole transporting layers 16G/B are formed above the pixel electrodes 13G/B excluding regions on the row banks 14X, and as depicted in FIG. 15B, the positive hole transporting layer 16R is formed above the pixel electrode 13R excluding regions on the row banks 14X and the opening adjusting layers 14IR. Incidentally, as described above, the positive hole transporting layer 16 may be continuous with a film of the same component formed on the row banks 14X and/or on the opening adjusting layers 14IR. However, this film does not function as the positive hole transporting layer 16, and may be present or may not be present.

(8) Film Formation of Light Emitting Layers

Figure 12C:
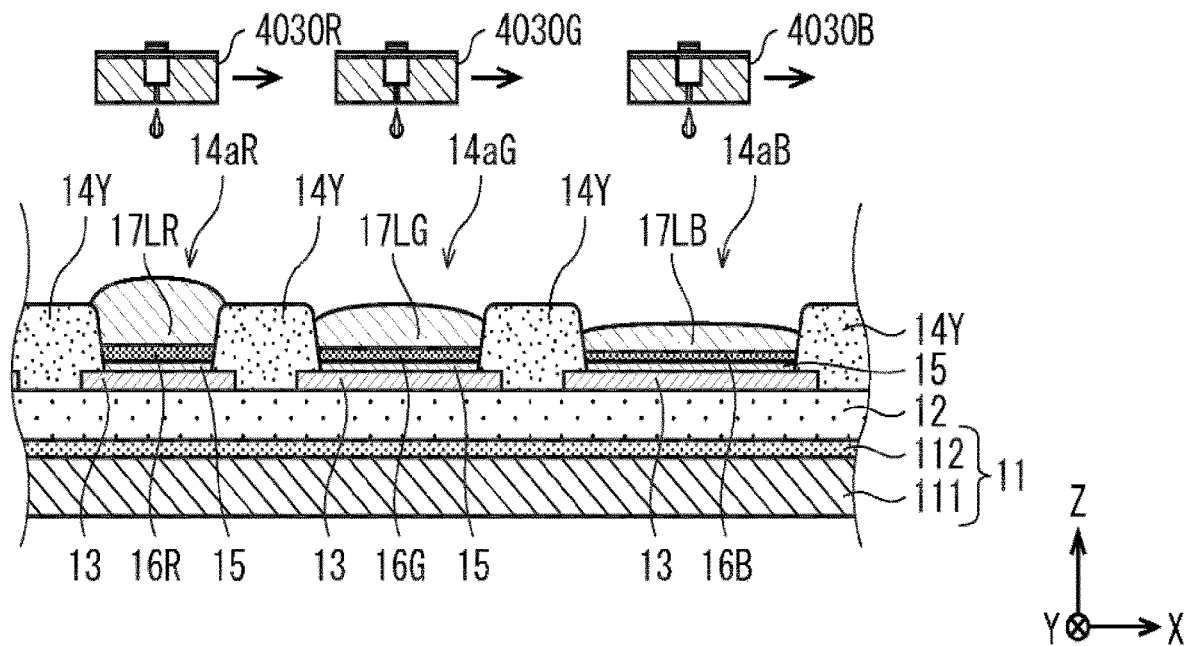
Figure 12D:
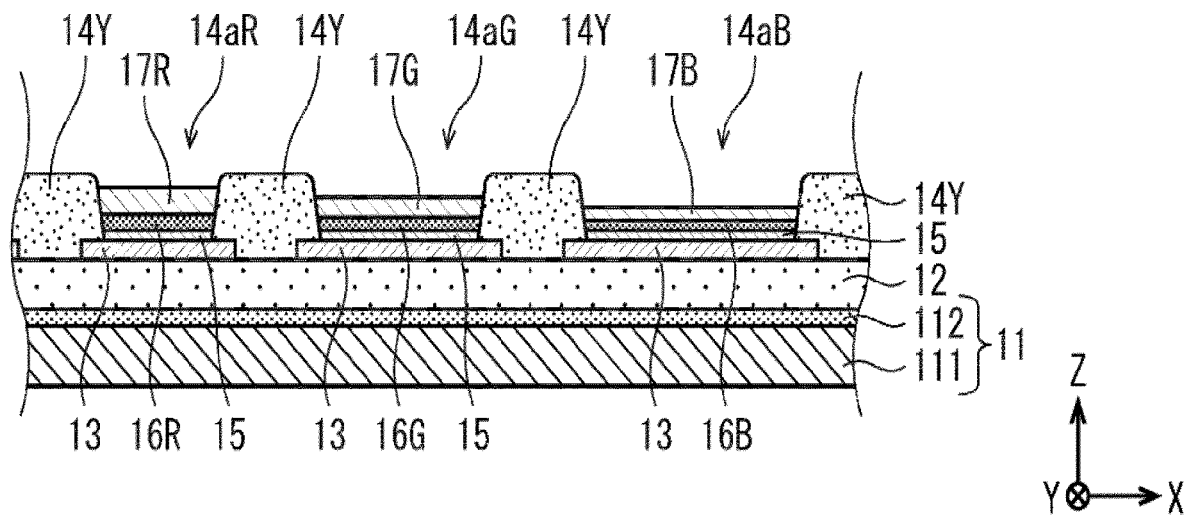

Next, as depicted in FIG. 12C, inks including constituent materials for light emitting layers 17R/G/B are respectively discharged from nozzles 4030R/4030G/4030B of the coating device, and are thus applied onto the positive hole transporting layers 16 in the gaps 14aR, 14aG, and 14aB, respectively. Then, as depicted in FIG. 12D, light emitting layers 17R, 17G, and 17B are formed by performing firing (drying) (step S80).

(9) Film Formation of Electron Transporting Layer

Figure 13A:
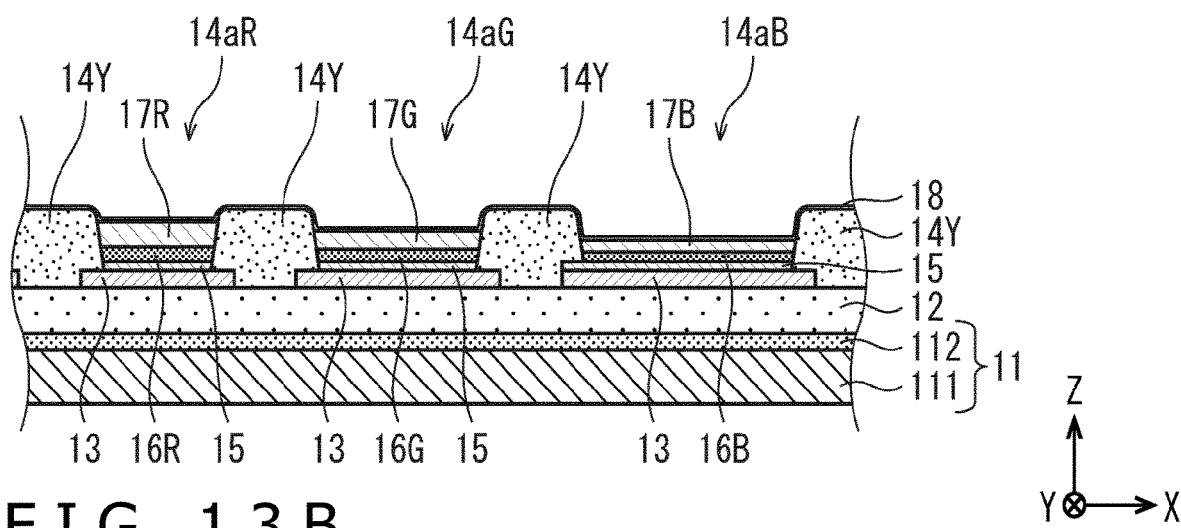
FIGS. 13A, 13B, 13C, and 13D are fragmentary sectional views schematically depicting a part of the processes of manufacturing the display panel according to the embodiment, FIG. 13A being a fragmentary sectional view depicting a state in which an electron transporting layer is formed on the column banks and on the light emitting layers, FIG. 13B being a fragmentary sectional view depicting a state in which an electron injection layer is formed on the electron transporting layer, FIG. 13C being a fragmentary sectional view depicting a state in which a counter electrode is formed on the electron injection layer, and FIG. 13D being a fragmentary sectional view depicting a state in which a sealing layer is formed on the counter electrode.

Next, as depicted in FIG. 13A, an electron transporting layer 18 is formed by film-forming a material constituting the electron transporting layer 18 on the light emitting layers 17R, 17G, and 17B and on the column banks 14Y so as to be common to each subpixel by a vacuum evaporation method or a sputtering method (step S90).

(10) Film Formation of Electron Injection Layer

Figure 13B:
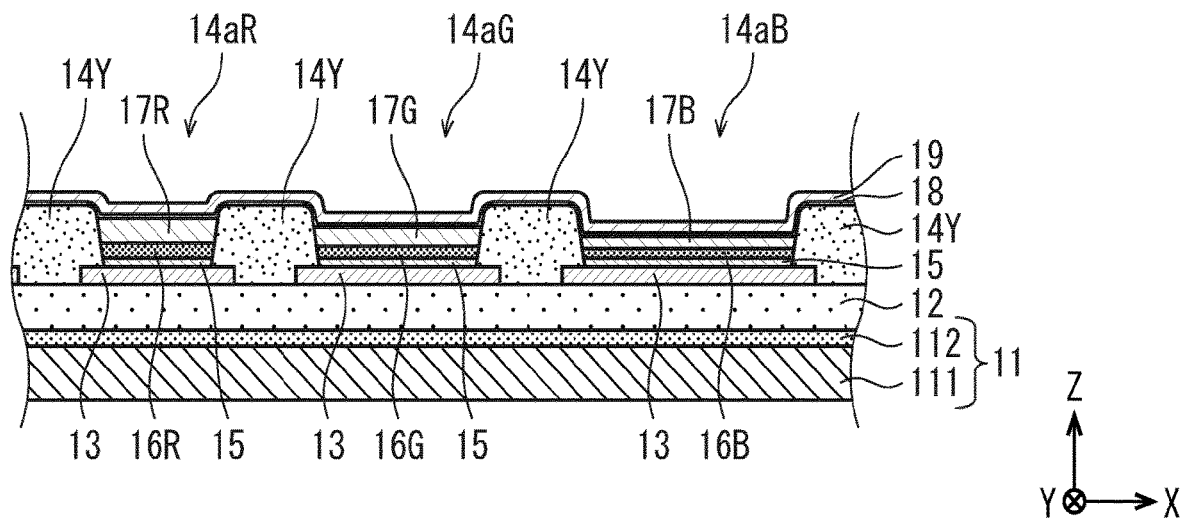

Next, as depicted in FIG. 13B, an electron injection layer 19 is formed by film-forming a material constituting the electron injection layer 19 on the electron transporting layer 18 so as to be common to each subpixel by a vacuum evaporation method or a sputtering method (step S100).

(11) Film Formation of Counter Electrode

Figure 13C:
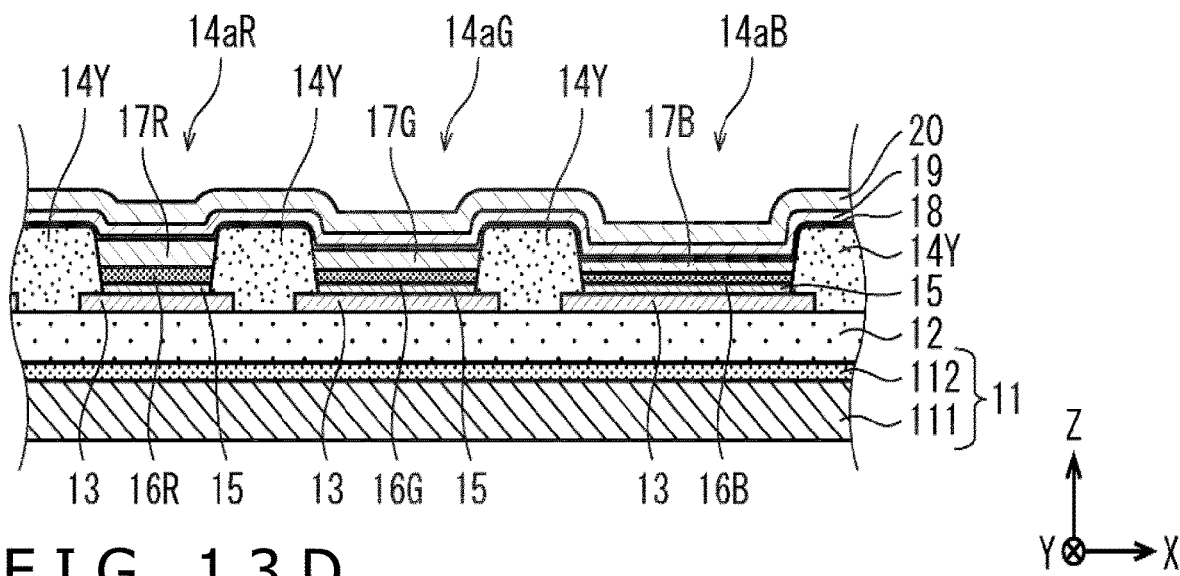

Next, as depicted in FIG. 13C, a counter electrode 20 is formed by film-forming a material constituting the counter electrode 20 on the electron injection layer 19 so as to be common to each subpixel by a vacuum evaporation method or a sputtering method (step S110).

(12) Film Formation of Sealing Layer

Figure 13D:
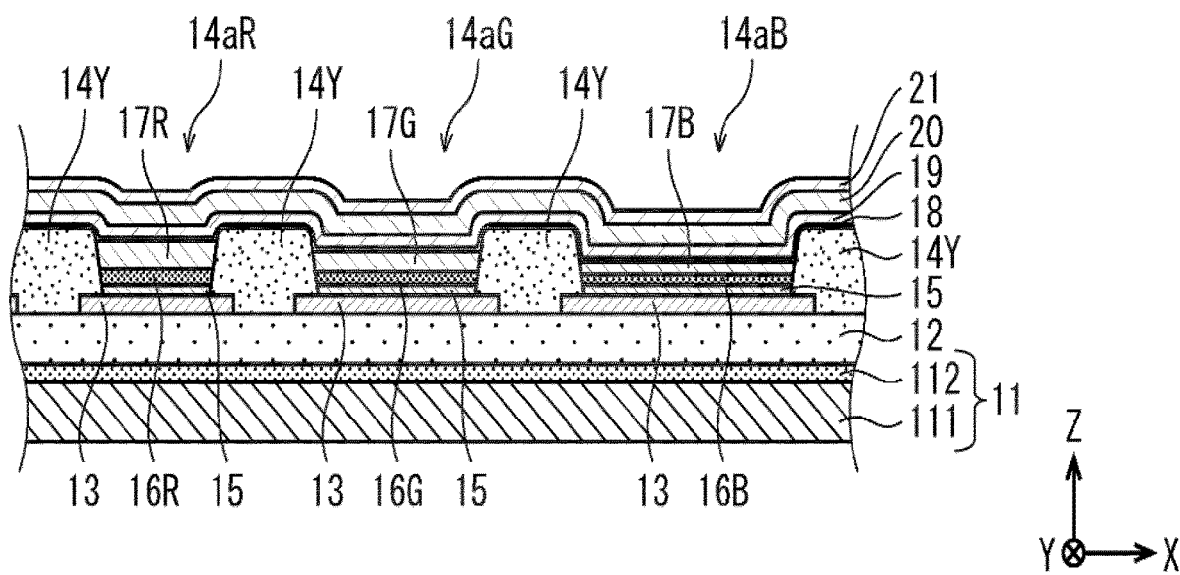

Finally, as depicted in FIG. 13D, a sealing layer 21 is formed by film-forming a material for forming the sealing layer on the counter electrode 20 so as to be common to each subpixel by a CVD method or a sputtering method (step S120).

The organic EL display panel 10 is completed by undergoing the above processes. According to the above-described method, even in a case where there is a large difference in film thickness between the positive hole transporting layer 16R and the positive hole transporting layers 16G and 16B, the positive hole transporting layers 16R, 16G, and 16B can be applied so as not to make the liquid surface of the ink in the opening 14aR too high even when the liquid surface of the ink in the openings 14aG and 14aB is not made too low in a case where the same ink is used. Hence, the positive hole transporting layers 16R, 16G, and 16B can be formed by the same coating device using the same ink even when there is a large difference in film thickness between the positive hole transporting layer 16R and the positive hole transporting layers 16G and 16B, so that the display panel can be formed efficiently.

<<First Modifications>>

In the display panel 10 according to the embodiment, as depicted in FIG. 4, FIG. 5, and the like, the opening adjusting layer 14I is configured to project in the Y-direction (positive direction) from the row bank 14X. However, the planar shape of the opening adjusting layer 14I as viewed in plan is not limited to the above-described case, but may be such shapes as will be described in the following.

Figure 16A:
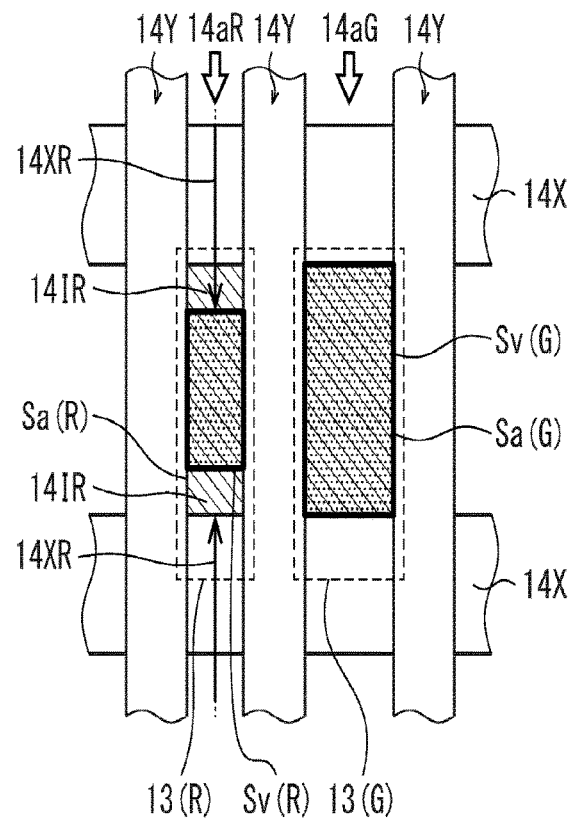
FIGS. 16A to 16D are plan schematic views depicting the shapes of opening adjusting layers in the display panel according to the embodiment.

FIG. 16A represents the shape of opening adjusting layers 14I according to one of first modifications. As depicted in FIG. 16A, the opening adjusting layers 14I extend in both of the Y-direction (positive direction) and the Y-direction (negative direction) from row banks 14X. A region sandwiched between the two opening adjusting layers 14I is the self-luminous region 100a in which the positive hole transporting layer 16R is formed.

Figure 16B:
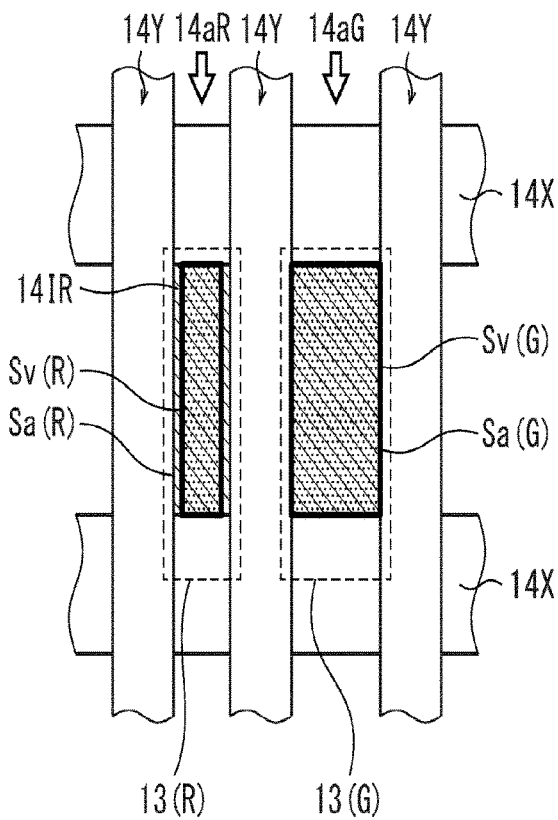

FIG. 16B represents the shape of opening adjusting layers 14I according to another one of the first modifications. As depicted in FIG. 16B, the opening adjusting layers 14I extend in both of the X-direction (positive direction) and the X-direction (negative direction) from lower portions of column banks 14Y. A region sandwiched between the two opening adjusting layers 14I is the self-luminous region 100a in which the positive hole transporting layer 16R is formed.

Figure 16C:
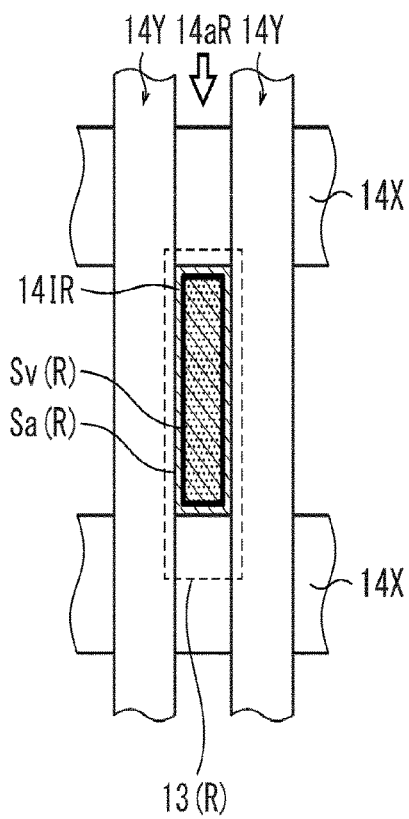

FIG. 16C represents the shape of an opening adjusting layer 14I according to another one of the first modifications. As depicted in FIG. 16C, the opening adjusting layer 14I is formed on a frame extending inward from outer edges of an area defined by row banks 14X and column banks 14Y. An opening portion on the inside of the opening adjusting layer 14I is the self-luminous region 100a in which the positive hole transporting layer 16R is formed.

Figure 16D:
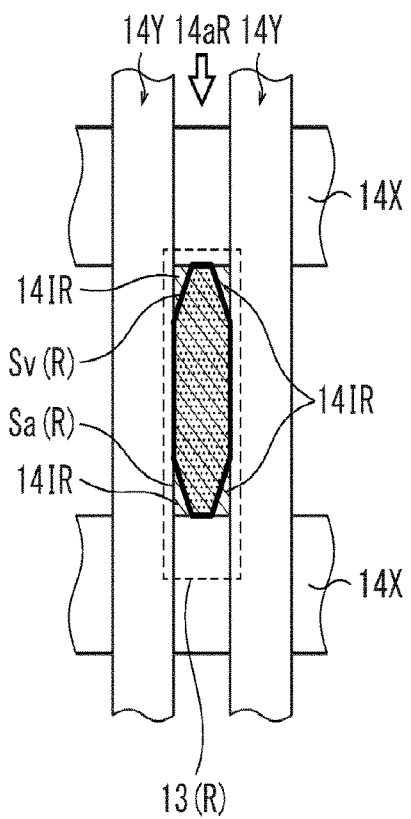

FIG. 16D represents the shape of opening adjusting layers 14I according to another one of the first modifications. As depicted in FIG. 16D, the opening adjusting layers 14I are formed so as to extend inward from four corners of an area defined by row banks 14X and column banks 14Y. An octagonal part defined by the row banks 14X, the column banks 14Y, and the opening adjusting layers 14I is the self-luminous region 100a in which the positive hole transporting layer 16R is formed.

It is to be noted that the planar shapes of the opening adjusting layers 14I are not limited to the above-described shapes, but may be a freely selected shape as long as the shape decreases the area of the self-luminous region 100a in which the positive hole transporting layer 16R is formed by covering a part of the area defined by the row banks 14X and the column banks 14Y.

In addition, as described above, a pixel electrode 13 does not need to be formed in a part under the opening adjusting layer 14I. For example, in the example depicted in FIG. 16B, the pixel electrode 13R may have a shorter length in the X-direction than the pixel electrode 13G/B by an amount corresponding to the opening adjusting layer 14I, or in the example depicted in FIG. 16A, a part of portions of the pixel electrode 13R which portions are under the opening adjusting layers 14I may not present as long as the pixel electrode 13R is electrically connected to the contact hole.

Here, when the opening adjusting layer 14I and the row bank 14X have a same height, and the opening adjusting layer 14I and the row bank 14X are in contact with each other, it is difficult to distinguish the opening adjusting layer 14I and the row bank 14X from each other in appearance. In particular, in a case where the opening adjusting layer 14I has a shape extending in the row direction (X-direction) as in the embodiment and FIG. 16A, a composition of the row bank 14X and the opening adjusting layer 14I is an apparent row bank. In such a case, it can be said that the opening adjusting layer 14I is present when the width in the column direction (Y-direction) of the apparent row bank as the composition of the opening adjusting layer 14I and the row bank 14X is larger than the width in the column direction of a composite part of a single row bank 14X. That is, in the opening 14aR, the width of an apparent row bank 14XR is larger than the width of row banks in the opening 14aG and the opening 14aB by the width of the opening adjusting layer 14I. In other words, when the width in the column direction of the row bank 14XR in the opening 14aR is larger than the width in the column direction of the row banks 14X in the opening 14aG and the opening 14aB, it can be said that the opening adjusting layer 14I is formed on the pixel electrode 13R in the opening 14aR, and that the width in the column direction of the opening adjusting layer 14I is equal to a difference between the width in the column direction of the row bank 14XR in the opening 14aR and the width in the column direction of the row banks 14X in the opening 14aG and the opening 14aB.

<<Second Modifications>>

The display panel 10 according to the embodiment has a configuration in which rectangular light emitting elements 100 are arranged in the form of a matrix. However, the planar shape and arrangement of the light emitting elements 100 are not limited to this, but may be such shapes as will be described in the following.

Figure 17A:
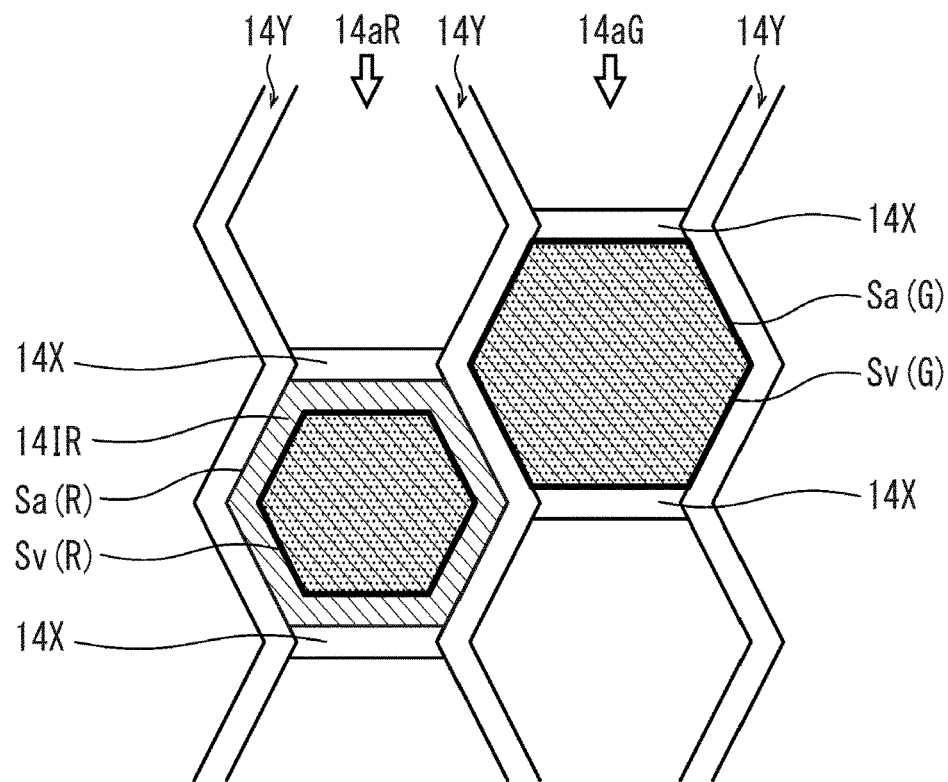
FIGS. 17A and 17B are plan schematic views depicting the shapes of opening adjusting layers in the display panel according to the embodiment.

FIG. 17A represents the shape and arrangement of light emitting elements according to one of second modifications. As depicted in FIG. 17A, the light emitting elements have a regular hexagonal shape, and are arranged closely. Light emitting elements of a same color are arranged in the column direction, and light emitting element columns are demarcated from each other by a partition wall 14Y on a polygonal line corresponding to a column bank. In addition, two light emitting elements of a same color which light emitting elements are arranged in the column direction are demarcated by an inter-pixel regulating layer 14X corresponding to a row bank. In this case, the opening adjusting layer 14IR is formed on an outer frame along the perimeter of a regular hexagonal shape demarcated by partition walls 14Y and inter-pixel regulating layers 14X, and an opening portion on the inside of the opening adjusting layer 14I is the self-luminous region 100a in which the positive hole transporting layer 16R is formed.

Figure 17B:
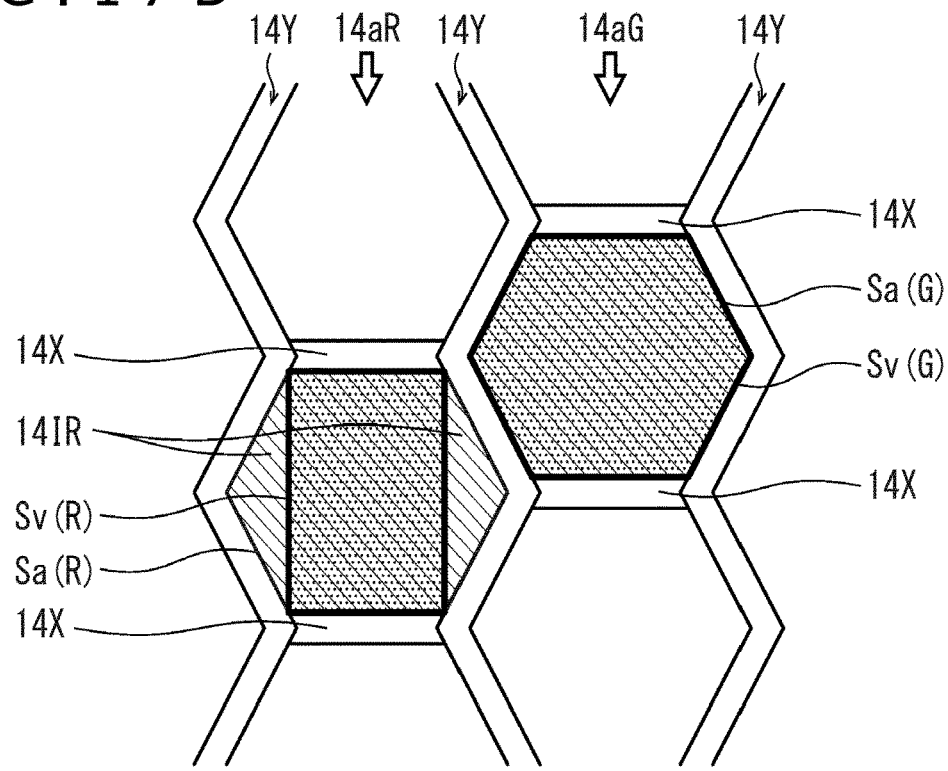

FIG. 17B represents the shape of opening adjusting layers according to another one of the second modifications. As depicted in FIG. 17B, the shape and arrangement of light emitting elements are the same as in FIG. 17A. In this case, the opening adjusting layers 14IR are triangles along two partition walls 14Y, and a rectangular part defined by inter-pixel regulating layers 14X and the opening adjusting layers 14IR is the self-luminous region 100a.

It is to be noted that the shape and arrangement of the light emitting elements and the planar shapes of the opening adjusting layers 14I are not limited to the foregoing, but may be freely selected shapes.

<<Third Modifications>>

The display panel 10 according to the embodiment is of a so-called line bank type in which light emitting elements 100 having different light emission colors are demarcated from each other by a column bank 14Y, and a flow of material ink for a functional layer is permitted in light emitting elements 100 having a same light emission color which light emitting elements are adjacent to each other in the Y-direction (column direction) in a manufacturing process. However, the structure of partition walls is not limited to the foregoing case, but may be a so-called pixel bank type in which individual light emitting elements 100 are demarcated by partition walls, for example.

Figure 18A:
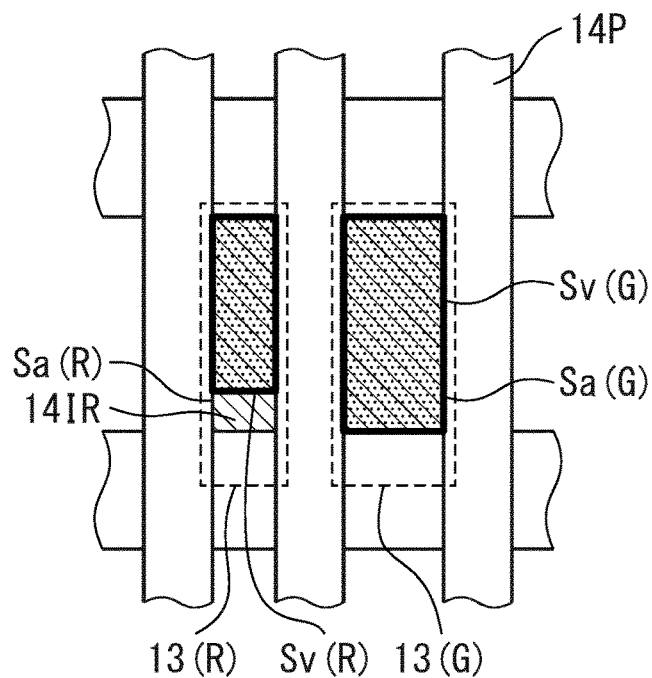
FIGS. 18A to 18E are plan schematic views depicting the shapes of opening adjusting layers in the display panel according to the embodiment.

FIG. 18A represents the shapes of partition walls and an opening adjusting layer 14I according to one of third modifications. As depicted in FIG. 18A, partition walls 14P are partition walls in a lattice form, and a light emitting element 100 is formed in each opening demarcated by the partition walls 14P. The opening adjusting layer 14I is disposed in a part in the Y-direction (lower side within the drawing) as in the embodiment, and a region demarcated by the partition walls 14P and the opening adjusting layer 14I is the self-luminous region 100a in which the positive hole transporting layer 16R is formed.

Figure 18B:
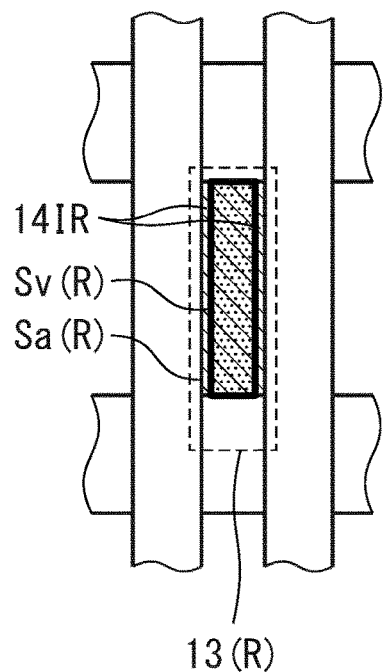

FIG. 18B represents the shape of opening adjusting layers 14I according to another one of the third modifications. As depicted in FIG. 18B, the shape of partition walls 14P is that of partition walls in a lattice form as in FIG. 18A. The opening adjusting layers 14I are provided on both sides in the X-direction (horizontal direction within the drawing) as in FIG. 16B, and a region demarcated by the partition walls 14P and the opening adjusting layers 14I is the self-luminous region 100a in which the positive hole transporting layer 16R is formed.

Figure 18C:
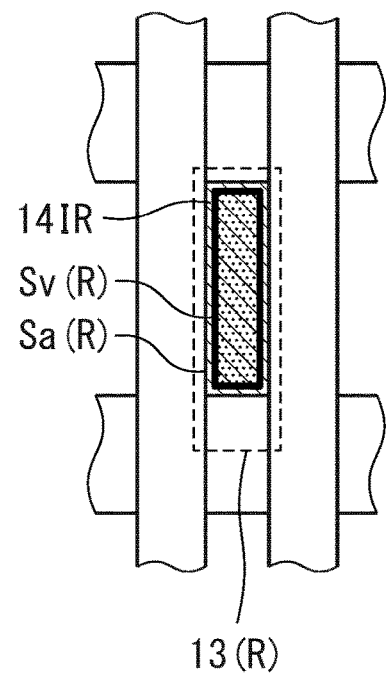

FIG. 18C represents the shape of an opening adjusting layer 14I according to another one of the third modifications. As depicted in FIG. 18C, the shape of partition walls 14P is that of partition walls in a lattice form as in FIG. 18A. As in FIG. 16C, the opening adjusting layer 14I is provided in the shape of a frame along the outer edges of a region demarcated by the partition walls 14P, and an opening portion on the inside of the opening adjusting layer 14I is the self-luminous region 100a in which the positive hole transporting layer 16R is formed.

Figure 18D:
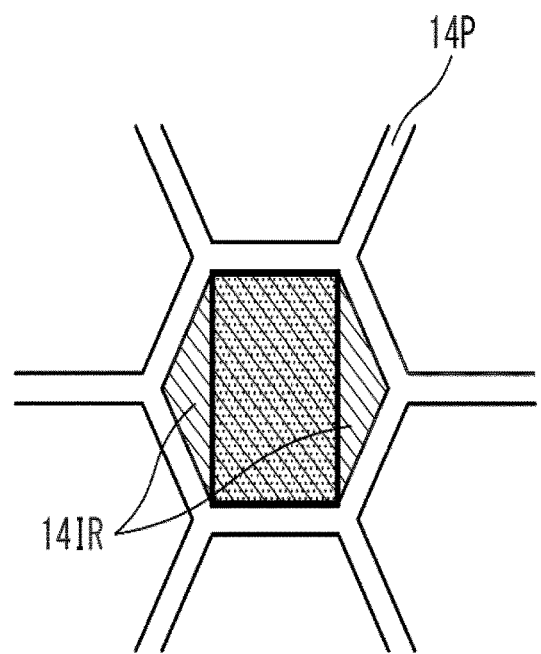

FIG. 18D represents the shape of a partition wall and opening adjusting layers 14I according to another one of the third modifications. As depicted in FIG. 18D, the shape of a partition wall 14P is a so-called honeycomb structure, and is a shape obtained by setting both of the inter-pixel regulating layers 14X and the partition walls 14Y in FIGS. 17A and 17B as the partition wall 14P. The opening adjusting layers 14I are provided on both sides in the X-direction (horizontal direction within the drawing) as in FIG. 17A, and a region demarcated by the partition wall 14P and the opening adjusting layers 14I is the self-luminous region 100a in which the positive hole transporting layer 16R is formed.

Figure 18E:
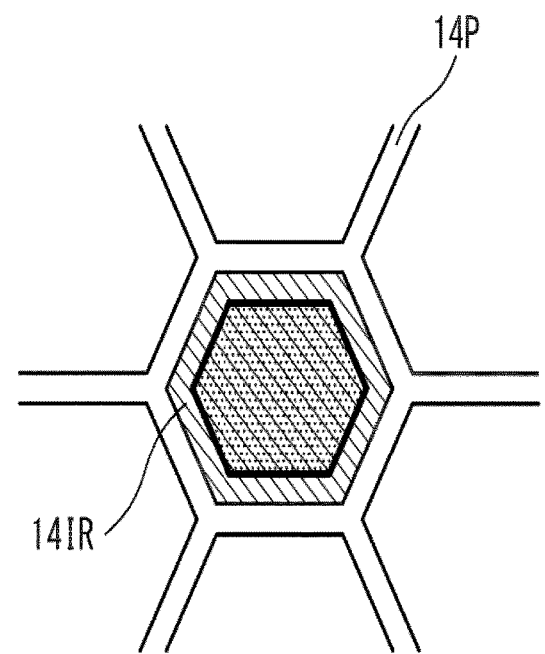

FIG. 18E represents the shape of an opening adjusting layer 14I according to another one of the third modifications. As depicted in FIG. 18C, the shape of a partition wall 14P is that of a partition wall of a honeycomb structure as in FIG. 18D. The opening adjusting layer 14I is provided along the outer edges of a region demarcated by the partition wall 14P as in FIG. 17B, and an opening portion on the inside of the opening adjusting layer 14I is the self-luminous region 100a in which the positive hole transporting layer 16R is formed.

It is to be noted that the shapes of the partition walls are not limited to the above-described shapes, but may be freely selected shapes as long as the shapes of the partition walls demarcate each light emitting element. In addition, the planar shapes of the opening adjusting layers 14I are not limited to the above-described shapes, but may be a freely selected shape as long as the shape decreases the area of the self-luminous region 100a in which the positive hole transporting layer 16R is formed by covering a part of the area demarcated by the partition wall(s).

Other Modifications of Embodiments (1) In each of the foregoing embodiments, description has been made of a case where the film thicknesses of the positive hole transporting layers are decreased in order of R, G, and B in the display panel provided with three kinds of light emitting layers emitting light in R, G, and B, respectively. However, the order of the film thicknesses of the positive hole transporting layers is not limited to the above, but may be freely selected, and it suffices to provide the opening adjusting layer 14I to a light emitting element in which the film thickness of the positive hole transporting layer is largest.

Incidentally, as described above, the opening adjusting layer 14I may be similarly provided also in a case where the film thicknesses of functional layers other than the positive hole transporting layers are different for the respective light emission colors.

Further, the light emission color for which the opening adjusting layer 14I is provided is not limited to one kind, but the opening adjusting layer 14I may be provided for two kinds or more of light emission colors.

(2) In the foregoing embodiments, description has been made of the organic EL display panel provided with three kinds of light emitting layers emitting light in R, G, and B, respectively. However, the kinds of light emitting layers may be two kinds, or may be four kinds or more. Here, the kinds of light emitting layers refer to variations in film thickness of the light emitting layers and the functional layers. When the film thicknesses of the light emitting layers and the functional layers are different from each other even in a same light emission color, the layers may be considered to be different kinds of light emitting layers. In addition, the arrangement of light emitting layers is not limited to the arrangement of RGBRGB . . . , but may be an arrangement of RGBBGRRGB . . . , or an auxiliary electrode layer or another non-self-luminous region may be provided between pixels.

(3) In the foregoing embodiments, the positive hole injection layers 15 and the positive hole transporting layers 16 are all formed by a coating method in the organic EL element 100. However, it suffices to form at least either the positive hole injection layers 15 or the positive hole transporting layers 16 by a coating method, and the other layers may be formed by another method, for example, an evaporation method, a sputtering method, or the like.

In addition, the positive hole injection layers 15, the positive hole transporting layers 16, the electron transporting layer 18, and the electron injection layer 19 do not necessarily need to be of the configuration in the foregoing embodiments. Either one or more thereof may not be provided, or another functional layer may be further provided. In addition, a single electron injection and transporting layer may be provided in place of the electron transporting layer 18 and the electron injection layer 19, for example.

(4) In the foregoing embodiments, description has been made of a case where the organic EL display panel is of a top emission type, and the pixel electrodes have light reflectivity and the counter electrode has optical transparency. However, the organic EL display panel according to the present disclosure may be of a so-called bottom emission type.

(5) The organic EL display panel and the organic EL display device according to the present disclosure have been described above on the basis of embodiments and modifications. However, the present disclosure is not limited to the foregoing embodiments and modifications. Forms obtained by subjecting the foregoing embodiments and modifications to various kinds of modifications occurring to those skilled in the art and forms realized by arbitrarily combining constituent elements and functions in the embodiments and the modifications without departing from the spirit of the present disclosure are also included in the present disclosure.

The present disclosure is useful in manufacturing an organic EL display panel having excellent light emission characteristics by easily controlling the film thicknesses of functional layers in the organic EL display panel in which the functional layers are formed by a coating method.

It should be understood by those skilled in the art that various modifications, combinations, sub-combinations and alterations may occur depending on design requirements and other factors insofar as they are within the scope of the appended claims or the equivalent thereof.

What is claimed is:

1. A display panel in which a plurality of pixel regions are arranged in a matrix form, the display panel comprising:
   a substrate;
   a plurality of pixel electrodes arranged in the plurality of respective pixel regions on the substrate;
   a partition wall that is disposed between pixel electrodes adjacent to each other in a row direction and that extends in a column direction;
   an inter-pixel regulating layer disposed between pixel electrodes adjacent to each other in the column direction and extending in the row direction,
      wherein an area of each pixel region of the plurality of pixel regions is an opening area defined by two respective partition walls adjacent to each other in the row direction and two respective inter-pixel regulating layers adjacent to each other in the column direction;
   a first functional layer disposed on or above a pixel electrode within one pixel region of the plurality of pixel regions, and between the two respective partition walls adjacent to each other in the row direction;
   a first light emitting layer formed on or above the first functional layer;
   a second functional layer disposed on or above a pixel electrode within another pixel region, of the plurality of pixel regions, adjacent in the row direction to the one pixel region and between two respective partition walls adjacent to each other in the row direction, the second functional layer including a same material as the first functional layer and having a smaller film thickness than a film thickness of the first functional layer; and a second light emitting layer disposed on or above the second functional layer, a wavelength of a light emission color of the second light emitting layer being shorter than a wavelength of a light emission color of the first light emitting layer, wherein as viewed in plan, a ratio of an area of the first functional layer to an area of the one pixel region in which the first functional layer is present is lower than a ratio of an area of the second functional layer to an area of the another pixel region in which the second functional layer is present.

2. The display panel according to claim 1, further comprising an opening adjusting layer disposed on the pixel electrode in the one pixel region in which the first functional layer is present, the opening adjusting layer having an upper surface at a height equal to or less than a height of the inter-pixel regulating layer when the substrate is set as a reference, wherein the area of the first functional layer is smaller than the area of the one pixel region due to absence of the first functional layer on or above the opening adjusting layer.

3. The display panel according to claim 1, further comprising an opening adjusting layer disposed so as to extend on the pixel electrode from the inter-pixel regulating layer in the one pixel region in which the first functional layer is present, the opening adjusting layer having an upper surface at a height lower than a height of the inter-pixel regulating layer when the substrate is set as a reference, wherein the area of the first functional layer is smaller than the area of the one pixel region due to absence of the first functional layer on or above the opening adjusting layer.

4. The display panel according to claim 2, wherein the opening adjusting layer and the inter-pixel regulating layer include a same material.

5. The display panel according to claim 1, wherein a width in the column direction of a first part of the inter-pixel regulating layer, is larger than a width in the column direction of a second part of the inter-pixel regulating layer, the first part straddles the one pixel region in which the first functional layer is present and a pixel region adjacent in the column direction to the one pixel region, the second part straddles the another pixel region in which the second functional layer is present and a pixel region adjacent in the column direction to the another pixel region, and the area of the first functional layer is smaller than the area of the one pixel region due to absence of the first functional layer on or above the inter-pixel regulating layer.

6. The display panel according to claim 1, wherein the pixel electrode is an anode, and the first functional layer has at least one of a positive hole injection function and a positive hole transporting function.

7. The display panel according to claim 1, wherein the first functional layer and the second functional layer are a coating film.

8. A display panel in which a plurality of pixel region columns are provided over a plurality of columns, the display panel comprising:

a substrate;

a plurality of pixel electrodes arranged in a plurality of pixel regions on the substrate;

a partition wall surrounding each pixel region;

an inter-pixel regulating layer and a first functional layer arranged so as not to overlap each other as viewed in plan within one pixel region of the plurality of pixel regions;

wherein an area of each pixel region of the plurality of pixel regions is an opening area defined by two respective partition walls adjacent to each other in a row direction and two respective inter-pixel regulating layers adjacent to each other in a column direction;

a first light emitting layer formed on or above the first functional layer;

a second functional layer disposed within an another pixel region in a pixel region column different from a pixel region column of the one pixel region, the second functional layer including a same material as the first functional layer and having a smaller film thickness than a film thickness of the first functional layer; and a second light emitting layer disposed on or above the second functional layer, a wavelength of a light emission color of the second light emitting layer being shorter than a wavelength of a light emission color of the first light emitting layer, wherein as viewed in plan, a ratio of an area of the first functional layer to an area of the one pixel region in which the first functional layer is present is lower than a ratio of an area of the second functional layer to an area of the another pixel region in which the second functional layer is present.

* * * * *